United States Patent
Park et al.

(10) Patent No.: US 11,096,293 B2
(45) Date of Patent: Aug. 17, 2021

(54) ELECTRONIC DEVICE AND DISPLAY DEVICE APPLIED TO THE SAME

(71) Applicant: SAMSUNG DISPLAY CO., LTD., Yongin-si (KR)

(72) Inventors: Jaechun Park, Seoul (KR); Changmin Park, Gwangmyeong-si (KR); Sang Wol Lee, Yongin-si (KR); Giljae Choi, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 41 days.

(21) Appl. No.: 16/663,156

(22) Filed: Oct. 24, 2019

(65) Prior Publication Data
US 2020/0137900 A1    Apr. 30, 2020

(30) Foreign Application Priority Data

Oct. 26, 2018 (KR) .......................... 10-2018-0129181
Feb. 26, 2019 (KR) .......................... 10-2019-0022717

(51) Int. Cl.
| | | |
|---|---|---|
| *H05K 1/02* | (2006.01) | |
| *H05K 5/00* | (2006.01) | |
| *H05K 5/02* | (2006.01) | |
| *H05K 7/16* | (2006.01) | |
| *H01L 27/32* | (2006.01) | |

(Continued)

(52) U.S. Cl.
CPC ........... *H05K 5/0017* (2013.01); *H05K 1/189* (2013.01); *H05K 5/03* (2013.01); *H05K 1/148* (2013.01); *H05K 2201/10128* (2013.01)

(58) Field of Classification Search
CPC .. H05K 1/02; H05K 5/00; H05K 5/02; H05K 7/16; H01L 27/32; H01L 51/00; H01L 51/52; H01L 51/56; G06F 1/16; G06F 3/041; G06F 3/044
USPC .............. 361/749, 679.01; 362/97.1; 16/233; 206/45.23
See application file for complete search history.

(56) References Cited

U.S. PATENT DOCUMENTS

2014/0029171 A1*  1/2014  Lee .......................... G09F 9/301
                                                361/679.01
2014/0111954 A1*  4/2014  Lee ....................... G06F 1/1652
                                                361/749

(Continued)

FOREIGN PATENT DOCUMENTS

KR    10-2014-0092119      7/2014
KR    10-2017-0111827      10/2017

(Continued)

*Primary Examiner* — Xiaoliang Chen
(74) *Attorney, Agent, or Firm* — F. Chau & Associates, LLC

(57) ABSTRACT

A display device is provided that includes a case comprising a bottom portion and a sidewall to define a receiving space in which the display device is accommodated. The display device comprises a display module with a display panel for displaying an image, a folding area, and a plurality of non-folding areas, and a circuit board electrically connected to the display panel. The folding area is capable of being folded about a folding axis and the non-folding areas are disposed adjacent to both sides of the folding area. A receiving groove is defined in the bottom portion of the case corresponding to a part mounting area of the circuit board. The circuit board is disposed on a rear surface of the display module.

14 Claims, 26 Drawing Sheets

(51) Int. Cl.
*H01L 51/00* (2006.01)
*H01L 51/52* (2006.01)
*H01L 51/56* (2006.01)
*G06F 1/16* (2006.01)
*G06F 3/041* (2006.01)
*G06F 3/044* (2006.01)
*H05K 5/03* (2006.01)
*H05K 1/18* (2006.01)
*H05K 1/14* (2006.01)

(56) References Cited

U.S. PATENT DOCUMENTS

| | | | |
|---|---|---|---|
| 2014/0198468 A1 | 7/2014 | Kim et al. | |
| 2015/0146387 A1* | 5/2015 | Lee | G06F 1/1679 |
| | | | 361/749 |
| 2015/0233162 A1* | 8/2015 | Lee | G06F 1/1626 |
| | | | 16/223 |
| 2016/0364044 A1* | 12/2016 | Kim | G06F 3/0445 |
| 2017/0062742 A1* | 3/2017 | Kim | H01L 51/5253 |
| 2017/0171939 A1* | 6/2017 | Yang | H05B 33/22 |
| 2017/0192572 A1* | 7/2017 | Han | G06F 3/04164 |
| 2017/0222179 A1* | 8/2017 | Park | H01L 51/5246 |
| 2017/0287992 A1 | 10/2017 | Kwak et al. | |
| 2018/0011576 A1* | 1/2018 | Ryu | G06F 1/1626 |
| 2018/0076412 A1 | 3/2018 | Kim et al. | |
| 2018/0096635 A1* | 4/2018 | Park | H01L 51/0097 |
| 2018/0097044 A1* | 4/2018 | Choi | H01L 27/3276 |
| 2018/0157362 A1 | 6/2018 | Kim et al. | |
| 2018/0351117 A1* | 12/2018 | Kim | H01L 51/5253 |

FOREIGN PATENT DOCUMENTS

| | | |
|---|---|---|
| KR | 10-2018-0029190 | 3/2018 |
| KR | 10-2018-0063633 | 6/2018 |

* cited by examiner

ELECTRONIC DEVICE AND DISPLAY DEVICE APPLIED TO THE SAME

CROSS-REFERENCE TO RELATED APPLICATIONS

This U.S. non-provisional patent application claims priorities under 35 U.S.C. § 119 to Korean Patent Application Nos. 10-2018-0129181, filed on Oct. 26, 2018, and 10-2019-0022717, filed on Feb. 26, 2019, the disclosures of which are incorporated by reference herein in their entireties.

TECHNICAL FIELD

The present disclosure provided herein relates to an electronic device, and more particularly, to an electronic device including a display device.

DISCUSSION OF RELATED ART

Electronic devices, such as smartphones, tablet computers, notebook computers, and smart televisions have been developed. These electronic devices include a display module that displays information to a user. These electronic devices further include various electronic modules in addition to the display module that are necessary for proper operation.

In recent years, display devices that include a flexible display substrate capable of being folded or rolled have been developed. In contrast to a flat, rigid display device, a flexible display device is capable of being folded, rolled, or bent. The flexible display device, is convenient to store and carry.

SUMMARY

The present disclosure provides for an electronic device that has increased product reliability and deformation resistance.

Embodiments of the present invention provide for an electronic device including a display device and/or a case including a bottom portion and a sidewall to define a receiving space in which the display device may be accommodated.

According to an exemplary embodiment of the present invention, a display device is provided that includes a case comprising a bottom portion and a sidewall to define a receiving space in which the display device is accommodated. The display device includes a display module with a display panel for displaying an image, a folding area, and a plurality of non-folding areas, and a circuit board electrically connected to the display panel. The folding area is capable of being folded about a folding axis and the non-folding areas are disposed adjacent to both sides of the folding area. A receiving groove is defined in the bottom portion of the case corresponding to a part mounting area of the circuit board. The circuit board is disposed on a rear surface of the display module.

According to an exemplary embodiment of the present invention, the display device further includes a cover panel disposed on a rear surface of the display module and which includes a plurality of layers. The cover panel is provided with an air gap portion defined therein between at least two layers among the layers to correspond to the part mounting area of the circuit board.

According to an exemplary embodiment of the present invention, the cover panel includes a support plate supporting the display module and a first adhesive film disposed between the support plate and the display module.

According to an exemplary embodiment of the present invention, the first adhesive film is provided with an opening defined therethrough to correspond to the air gap portion.

According to an exemplary embodiment of the present invention, the cover panel further includes a buffer film disposed between the first adhesive film and the display module and a second adhesive film disposed between the buffer film and the display module.

According to an exemplary embodiment of the present invention, the air gap portion includes an air gap defined by the opening between the buffer film and the support plate.

According to an exemplary embodiment of the present invention, the cover panel further includes a first step difference film disposed between the support plate and the buffer film corresponding to the opening.

According to an exemplary embodiment of the present invention, the first step difference film has a thickness smaller than the first adhesive film.

According to an exemplary embodiment of the present invention, the first step difference film is disposed on the support plate.

According to an exemplary embodiment of the present invention, the first step difference film has a width smaller than a width of the opening.

According to an exemplary embodiment of the present invention, the support plate includes a first support plate disposed in a first non-folding area adjacent to a first side of the folding area, and a second support plate spaced apart from the first support plate and disposed in a second non-folding area adjacent to a second side of the folding area.

According to an exemplary embodiment of the present invention, the first adhesive film includes a first sub-adhesive film fixing the first support plate to the first non-folding area and a second sub-adhesive film fixing the second support plate to the second non-folding area.

According to an exemplary embodiment of the present invention, the cover panel further includes a second step difference film disposed between the first and second sub-adhesive films and interposed between the display module and the support plate.

According to an exemplary embodiment of the present invention, the second step difference film includes a first sub-step difference film disposed on the first support plate and a second sub-step difference film disposed on the second support plate.

According to an exemplary embodiment of the present invention, the display module further includes a window disposed on the display panel and including a flexible material.

According to an exemplary embodiment of the present invention, a display device is provided including a display module. The display module includes a display panel for displaying an image and a circuit board electrically connected to the display panel and including a folding area folded about a folding axis and non-folding areas disposed adjacent to both sides of the folding area when viewed in a plan view. A cover panel is disposed on a rear surface of the display module and includes a plurality of layers. The circuit board is disposed on a rear surface of the cover panel. The cover panel is provided with an air gap portion that corresponds to a part mounting area of the circuit board and is defined between at least two layers of the cover panel.

According to an exemplary embodiment of the present invention, the cover panel includes a support plate disposed on the rear surface of the display module and a first adhesive film disposed between the support plate and the display module. The first adhesive film is provided with an opening defined there through to correspond to the air gap portion.

According to an exemplary embodiment of the present invention, the cover panel includes a buffer film disposed between the first adhesive film and the display module and a second adhesive film disposed between the buffer film and the display module.

According to an exemplary embodiment of the present invention, the air gap portion includes an air gap defined by the opening between the buffer film and the support plate.

According to an exemplary embodiment of the present invention, the cover panel further includes a first step difference film disposed between the support plate and the buffer film corresponding to the opening.

According to an exemplary embodiment of the present invention, the first step difference film has a thickness smaller than a thickness of the first adhesive film.

According to an exemplary embodiment of the present invention, the first step difference film is disposed on the support plate.

According to an exemplary embodiment of the present invention, the first step difference film has a width smaller than a width of the opening.

According to an exemplary embodiment of the present invention, a display device is provided including a display module. The display module includes a display panel for displaying an image and a circuit board electrically connected to the display panel and comprising a folding area folded a folding axis, and non-folding areas disposed adjacent to both sides of the folding area, when viewed in a plan view. A cover panel is disposed on a rear surface of the display module and includes a plurality of layers, the circuit board is disposed on a rear surface of the cover panel. The cover panel includes a support plate disposed on the rear surface of the display module. An adhesive film is disposed between the support plate and the display module, and a hydrophobic material layer is disposed between the support plate and the adhesive film in a region corresponding to a part mounting area of the circuit board.

According to an exemplary embodiment of the present invention, the hydrophobic material layer includes a hydrophobic material, and an adhesiveness of the adhesive film with respect to the support plate is lost by the hydrophobic material layer.

According to an exemplary embodiment of the present invention, the cover panel further includes a first insulating layer disposed between the support plate and the hydrophobic material layer to correspond to the part mounting area. A metal material layer is disposed between the hydrophobic material layer and the adhesive film, and a second insulating layer is disposed between the metal material layer and the adhesive film.

According to an exemplary embodiment of the present invention, the hydrophobic material layer includes a hydrophobic material, and an adhesiveness of the adhesive film with respect to the support plate is lost by the hydrophobic material layer and the metal material layer.

According to an exemplary embodiment of the present invention, the metal material layer includes at least one of silver (Ag) and aluminum (Al).

BRIEF DESCRIPTION OF THE FIGURES

The above and other features of the present invention will become readily apparent by reference to the following detailed description when considered in conjunction with the accompanying drawings wherein.

DETAILED DESCRIPTION OF THE EMBODIMENTS

Figure 1:
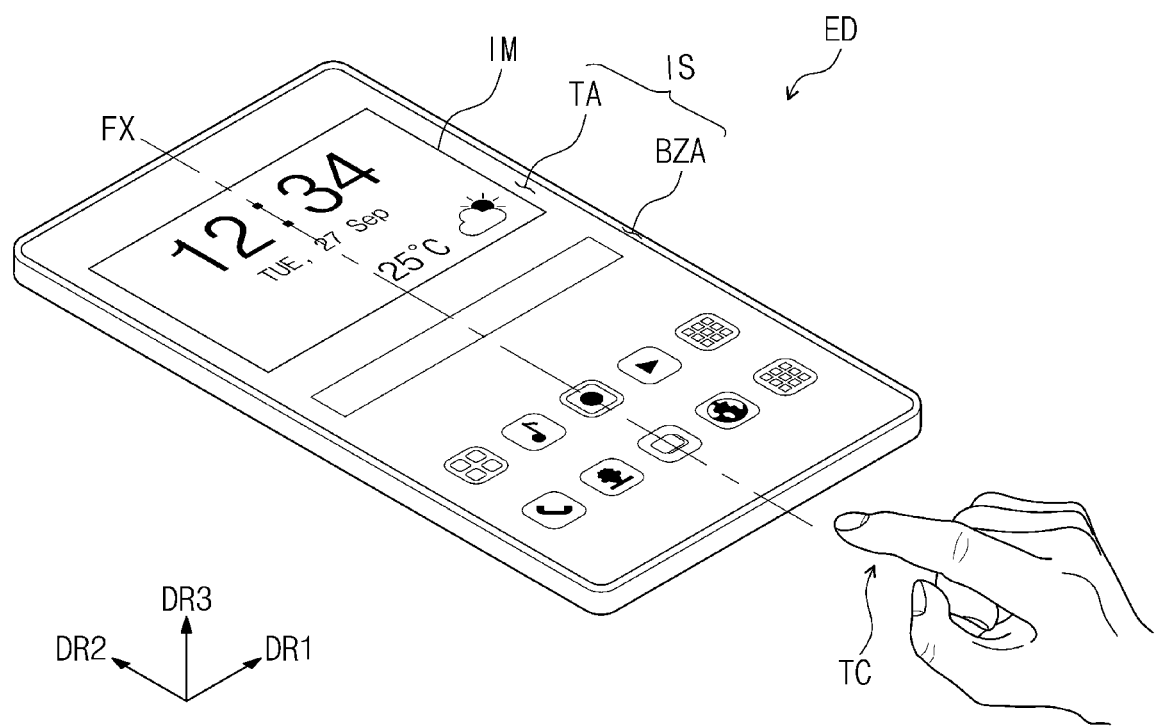
FIG. 1 is a perspective view illustrating an electronic device according to an exemplary embodiment of the present invention.

Hereinafter, the present invention will be described more fully with reference to the accompanying drawings in which various exemplary embodiments are shown.

Like numerals may refer to like elements throughout the following description. In the drawings, the thickness, ratio, and dimension of components may be exaggerated for effective illustration of the technical content. However, the present invention is not limited thereto.

Figure 2A:
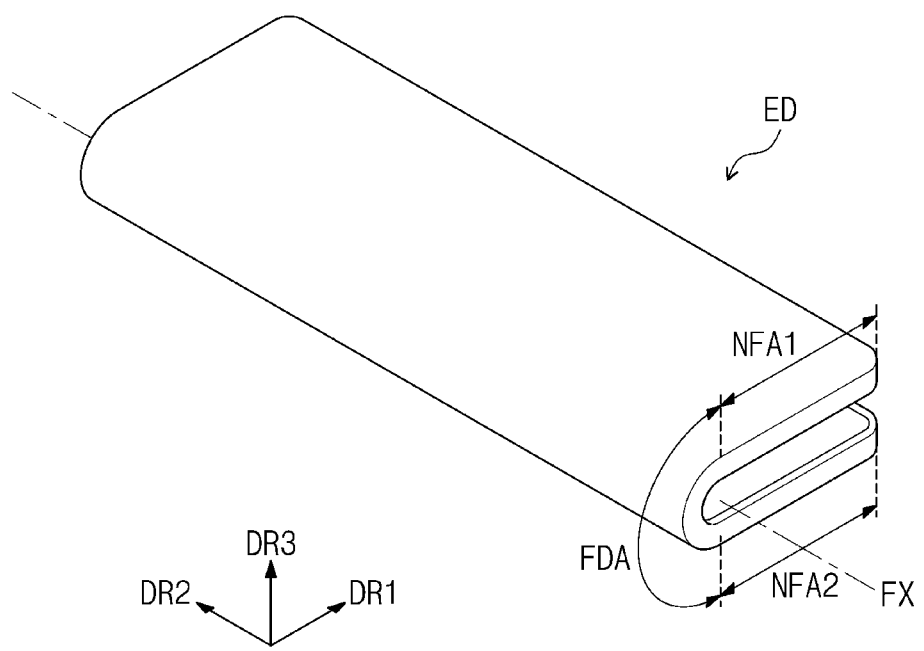
FIG. 2A is a view illustrating a folded state of the electronic device shown in FIG. 1, according to an exemplary embodiment of the present invention.
Figure 2B:
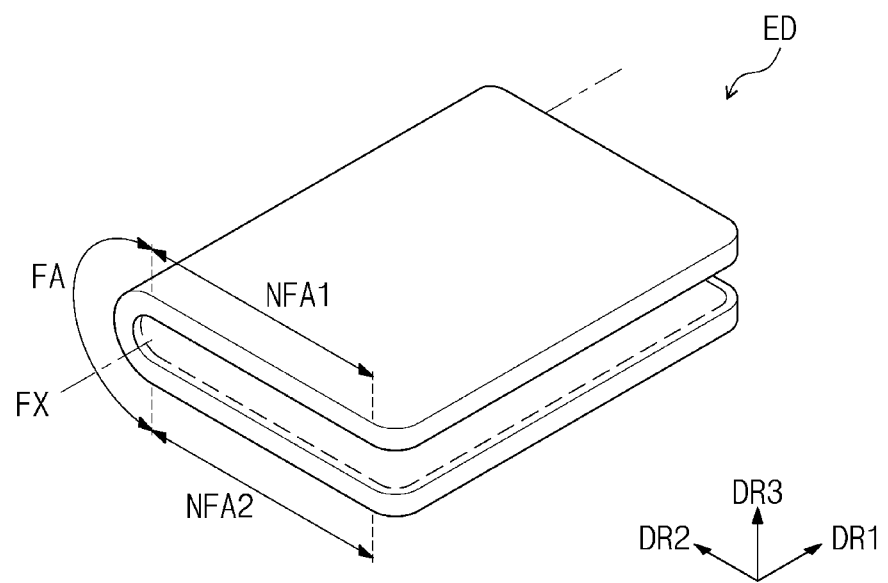
FIG. 2B is a view illustrating a folded state of an electronic device, according to an exemplary embodiment of the present invention.

FIG. 1 is a perspective view illustrating an electronic device ED according to an exemplary embodiment of the present invention, and FIG. 2A is a view illustrating a folded state of the electronic device ED shown in FIG. 1. FIG. 2B is a view illustrating a folded state of an electronic device ED according to an exemplary embodiment of the present invention.

Referring to FIGS. 1 and 2A, the electronic device ED, according to an exemplary embodiment of the present invention, has a rectangular shape defined by short sides extended in a first direction DR1 and long sides extended in a second direction DR2 crossing the first direction DR1. The electronic device ED has a thickness extended in a third direction (e.g., a DR3 direction). However, the shape of the electronic device ED is not limited thereto, and the electronic device ED may be formed to include various shapes.

The electronic device ED is a foldable electronic device. The electronic device ED, according to the exemplary embodiment of the present invention, can be folded about a folding axis FX extended in a predetermined direction. Hereinafter, a state in which the electronic device ED is folded about the folding axis FX is referred to as a folded state, and a state in which the electronic device ED is not folded is referred to as an unfolded state. According to an exemplary embodiment of the present invention, the folding axis FX extends in the second direction (e.g., the DR2 direction). The second direction (e.g., the DR2 direction) refers to a long axis direction of the electronic device ED, and as an example of the present invention, the electronic device ED can be folded about the long axis direction. For example, the long axis direction may be parallel to long sides of the electronic device ED.

According to an exemplary embodiment of the present invention, as shown in FIG. 2B, the folding axis FX may extend in the first direction (e.g., the DR1 direction), and the first direction (e.g., the DR1 direction) may refer to a short axis direction of the electronic device ED. For example, the short axis direction may be parallel to short sides of the electronic device ED. According to an exemplary embodiment of the present invention, the electronic device ED may be folded about the short axis direction.

The electronic device ED may be a display device. The electronic device ED, according to the present invention, may include a large-sized electronic item, such as a television set or a monitor, or a small to medium-sized item, such as a mobile phone, a tablet computer, a car navigation unit, or a game unit.

As shown in FIG. 1, the electronic device ED displays an image IM toward a third direction (e.g., a DR3 direction) through a display surface IS substantially parallel to a plane formed by the first direction (e.g., the DR1 direction) and the second direction (e.g., the DR2 direction). The display surface IS through which the image IM is displayed corresponds to a front surface of the electronic device ED.

The display surface IS of the electronic device ED is partitioned. For example, the display surface IS of the electronic device ED is divided into a transmission area TA and a bezel area BZA. The transmission area TA is an area through which the image IM is displayed, and a user views the image through the transmission area TA. The transmission area TA may be a quadrangular shape. The bezel area BZA at least partially surrounds the transmission area TA. Accordingly, the transmission area TA may have a shape defined by the bezel area BZA. However, the present invention is not limited thereto. For example, the bezel area BZA may be disposed adjacent to less than all four sides of the transmission area TA or may be omitted. The electronic device ED includes a case. The case is be disposed outside of the electronic device ED and accommodates components therein. The case will be described in further detail below with reference to FIG. 3.

The electronic device ED according to the present invention senses an externally applied user input TC. The user input TC may include various types of external inputs, such as a part of the user's body, light, heat, hovering and/or pressure. In the present exemplary embodiment, the user input TC is shown as a user's hand applied to the front surface. However, the present invention is not limited thereto. As described above, the user input TC is provided in various forms. In addition, the electronic device ED can sense the user input TC applied to a side or rear surface of the electronic device ED depending on its structure, however, the present invention is not limited thereto.

The electronic device ED activates the display surface IS to display the image IM and senses the external input TC. In the present exemplary embodiment, an area in which the external input TC is sensed is defined in the transmission area TA through which the image IM is displayed. However, the present invention is not limited thereto. For example, the area in which the external input TC is sensed may be defined in the bezel area BZA or may be defined across an entire area of the display surface IS.

As shown in FIGS. 1, 2A, and 2B, the electronic device ED according to the exemplary embodiment of the present invention can be folded about the folding axis FX. The electronic device ED includes a plurality of areas separated by the folding of the electronic device ED. The electronic device ED includes a folding area FDA and at least one non-folding area NFA1 or NFA2. The folding area FDA is defined between two non-folding areas NFA1 and NFA2. The folding area FDA is an area that can be bent in accordance with the folding operation and is an area to which a folding stress is applied.

As an example of the present invention, the non-folding areas NFA1 and NFA2 include a first non-folding area NFA1 and a second non-folding area NFA2. The first non-folding area NFA1 is disposed adjacent to one side of the folding area FDA in the first direction (e.g., the DR1 direction), and the second non-folding area NFA2 is disposed adjacent to the other side of the folding area FDA in the first direction (e.g., the DR1 direction).

The electronic device ED is capable of being inwardly folded (this may be referred to as "in-folding" or "in-folding state") or outwardly folded (this may be referred to as "out-folding" or "out-folding state"). In the present exemplary embodiment, the in-folding indicates a state in which the electronic device ED is folded to allow a portion of the display surface IS to face another portion of the display surface IS, and the out-folding indicates a state in which the electronic device ED is folded to allow a portion of the rear surface of the electronic device ED to face another portion of the rear surface of the electronic device ED. FIGS. 2A and 2B show the in-folding state of the electronic device ED as a representative example.

According to the present exemplary embodiment, one folding area FDA is defined in the electronic device ED, however, the number of the folding areas FDA should not be limited to one. According to an exemplary embodiment of the present invention, a plurality of folding areas may be defined in the electronic device ED.

Figure 3:
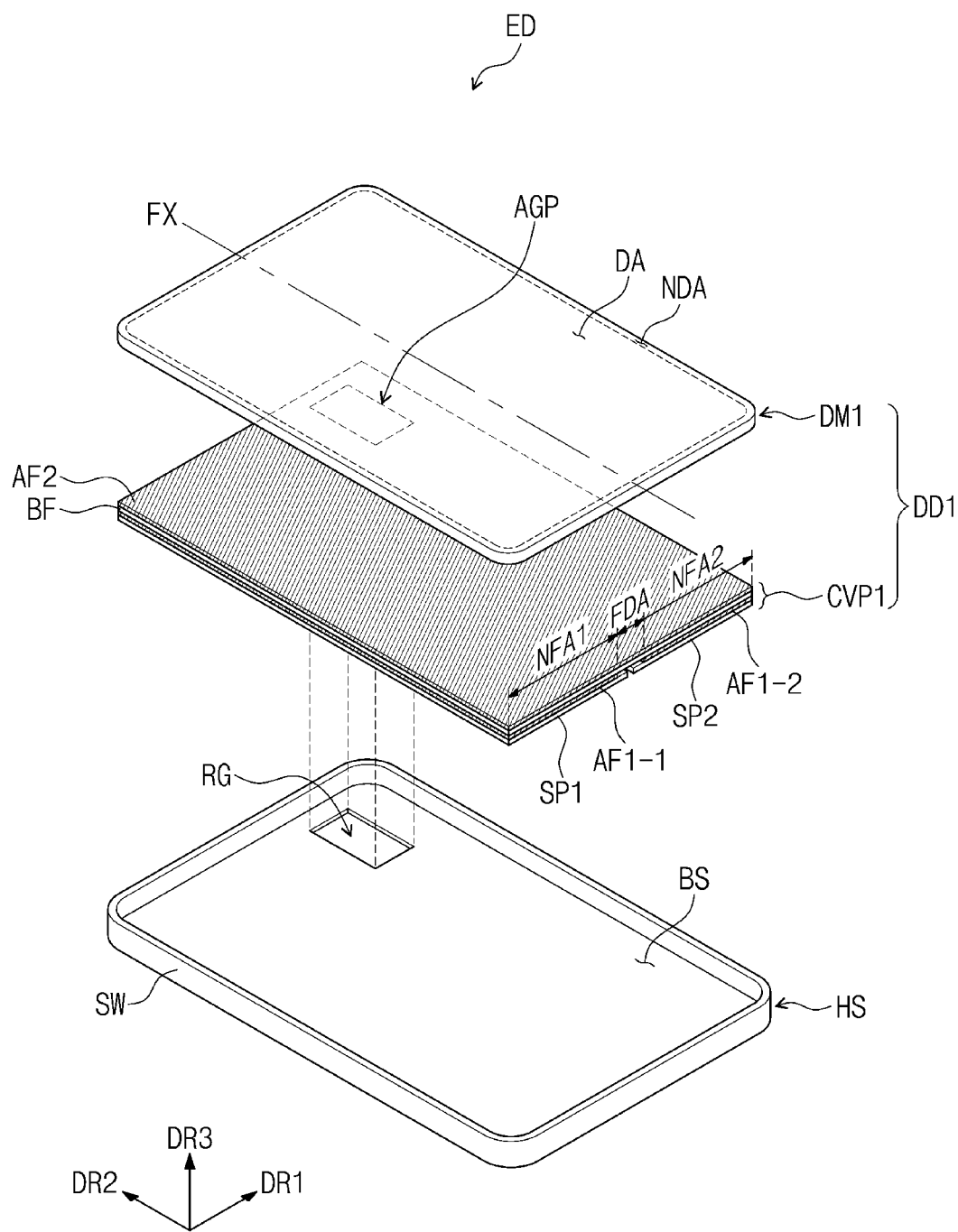
FIG. 3 is an exploded perspective view illustrating an electronic device shown in FIG. 1, according to an exemplary embodiment of the present invention.
Figure 4:
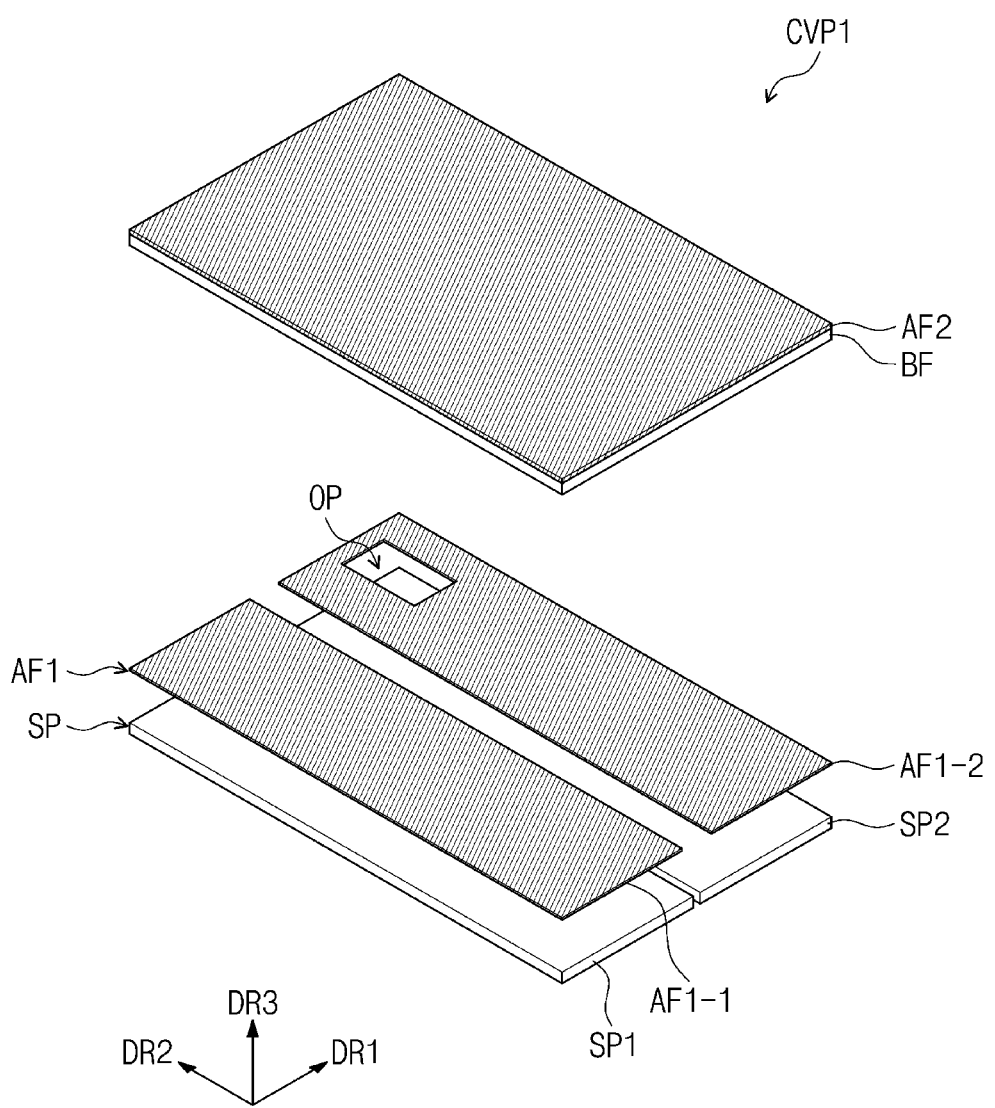
FIG. 4 is an exploded perspective view illustrating a cover panel shown in FIG. 3, according to an exemplary embodiment of the present invention.

FIG. 3 is an exploded perspective view illustrating the electronic device ED shown in FIG. 1, and FIG. 4 is an exploded perspective view illustrating a cover panel CVP1 shown in FIG. 3.

Referring to FIG. 3, the electronic device ED may include a display device DD1. In FIG. 3, configurations of the electronic device ED are shown in simplified schematic form for ease of illustration.

The display device DD1 includes a display module DM1 and the cover panel CVP1. The display module DM1 includes a display panel displaying an image and a window disposed on the display panel. The display module DM1 includes a display area DA and a non-display area NDA. The display area DA is an area through which the image is displayed and corresponds to the transmission area TA of the electronic device ED. The transmission area TA at least partially overlaps a surface of the display area DA.

The non-display area NDA is disposed adjacent to the display area DA. The non-display area NDA at least partially surrounds an edge of the display area DA. However, the present invention is not limited thereto. For example, the non-display area NDA may be disposed adjacent to only a portion of the edge of the display area DA. A driving circuit, a driving line, a pad, or the like, which are used to drive the display area DA, may be arranged in the non-display area NDA. The bezel area BZA corresponds to, or at least partially overlaps the non-display area NDA in a plan view.

When viewed in a plan view, the display module DM1 includes a folding area FDA folded about the folding axis FX, and first and second non-folding areas NFA1 and NFA2 disposed adjacent to respective sides of the folding area FDA. The folding area FDA and the first and second non-folding areas NFA1 and NFA2, which are defined in the display module DM1, correspond to the folding area FDA and the first and second non-folding areas NFA1 and NFA2 defined in the electronic device ED, and thus they are assigned with the same reference numerals.

Referring to FIGS. 3 and 4, the cover panel CVP1 is disposed under the display module DM1. The cover panel CVP1 is coupled to a rear surface of the display module DM1 (e.g., a surface opposite to the transmission area TA). The cover panel CVP1 supports the rear surface of the display module DM1. The cover panel CVP1 has a structure in which a plurality of layers are stacked in the third direction (e.g., the DR3 direction). The cover panel CVP1 may be provided with an air gap portion AGP defined therein. The cover panel CVP1 may separate at least two layers among the layers from each other. For example, the air gap portion AGP may provide a boundary at which adhesive force is absent to exist in any one of the layers of the cover panel CVP1. The air gap portion AGP may be defined by removing a portion of an adhesive interposed between two layers adjacent to each other among the layers of the cover panel CVP1.

As an example of the present invention, the cover panel CVP1 includes a first support plate SP and a first adhesive film AF1. The support plate SP is disposed on the rear surface of the display module DM1. The support plate SP may be a metal plate. For example, the support plate SP may be a stainless steel plate. The support plate SP may have a strength (e.g., resistance to deformation) greater than a strength (e.g., resistance to deformation) of the display module DM1.

The support plate SP includes a first support plate SP1 that supports the first non-folding area NFA1 of the display module DM1 and a second support plate SP2 that supports the second non-folding area NFA2 of the display module DM1. The first and second support plates SP1 and SP2 have a plate shape.

The first support plate SP1 and the second support plate SP2 are spaced apart from each other in the first direction (e.g., the DR1 direction). The first and second support plates SP1 and SP2 are spaced apart from each other in an area corresponding to the folding area FDA. For example, the first and second support plates SP1 and SP2 may be spaced apart from each other by a distance in the first direction (e.g., the DR1 direction). The first support plate SP1 overlaps a portion of the folding area FDA, an d the second support plate SP2 overlaps a portion of the folding area FDA. For example, the distance between the first and second support plates SP1 and SP2 may be smaller than a width of the folding area FDA in the first direction (e.g., the DR1 direction).

The first adhesive film AF1 is disposed between the support plate SP and the display module DM1. The first adhesive film AF1 includes a first sub-adhesive film AF1-1 and a second sub-adhesive film AF1-2. The first sub-adhesive film AF1-1 overlaps with the first non-folding area NFA1, and the second sub-adhesive film AF1-2 overlaps with the second non-folding area NFA2. The first and second sub-adhesive films AF1-1 and AF1-2 are spaced apart from each other in the first direction (e.g., the DR1 direction). The first and second sub-adhesive films AF1-1 and AF1-2 are spaced apart from each other in an area corresponding to the folding area FDA.

The first sub-adhesive film AF1-1 is disposed between the first support plate SP1 and the display module DM1, and the second sub-adhesive film AF1-2 is disposed between the second support plate SP2 and the display module DM1.

An opening OP may be defined through at least one of the first and second sub-adhesive films AF1-1 and AF1-2 to correspond to the air gap portion AGP. As an example of the present invention, the opening OP may be defined through a corner of the second sub-adhesive film AF1-2, however, the position of the opening OP should not be limited thereto. For example, the opening OP may be disposed in the center of the first and/or second sub-adhesive films AF1-1 and AF1-2 between short sides.

The cover panel CVP1 further includes a buffer film BF and a second adhesive film AF2. The buffer film BF is disposed between the first adhesive film AF1 and the display module DM1. The buffer film BF may include a polymer material. The buffer film BF is a layer that absorbs an impact applied from the outside. The buffer film BF has a thickness in the third direction (e.g., the DR3 direction) that is between about 50 µm to about 250 µm. The buffer film BF may have a modulus equal to or greater than about 0.01 Mpa to about 500 Mpa.

FIGS. 3 and 4 show a structure in which the buffer film BF includes one layer, however, the present invention is limited thereto. For example, the buffer film BF may include a plurality of layers, and a position of the buffer film BF may be varied.

The support plate SP may be fixed to the buffer film BF by the first adhesive film AF1. The support plate SP may be attached to a rear surface of the buffer film BF by the first adhesive film AF1. The buffer BF is formed over the folding area FDA and the first and second non-folding areas NFA1 and NFA2. The first support plate SP1 is attached to the rear surface of the buffer film BF by the first sub-adhesive film AF1-1, and the second support plate SP2 is attached to the rear surface of the buffer film BF by the second sub-adhesive film AF1-2.

The air gap portion AGP may be provided between the buffer film BF and the support plate SP by the opening OP. In particular, an air gap AG may be formed between the buffer film BF and the second support plate SP2 by the opening OP defined by removing a portion of the second sub-adhesive film AF1-2 (See FIG. 8). A portion of the display device DD1 in which the air gap AG is disposed may be defined as the air gap portion AGP.

The second adhesive film AF2 is disposed between the buffer film BF and the display module DM1 and may attach the buffer film BF to the rear surface of the display module DM1.

The first and second adhesive films AF1 and AF2 may include an optically clear material. The first and second adhesive films AF1 and AF2 may include an adhesive layer manufactured by coating a liquid adhesive material and curing the liquid adhesive material, or may be a separately manufactured adhesive sheet. For example, the first and second adhesive films AF1 and AF2 may include a pressure sensitive adhesive (PSA), an optical clear adhesive (OCA), and/or an optical clear resin (OCR).

Referring to FIG. 3 again, the electronic device ED may include a case HS cove ring the display device DD1. The case HS may include a bottom portion BS and a sidewall SW extending from the bottom portion BS in the third direction (e.g., the DR3 direction), and the display device DD1 may be accommodated in an inner space defined by the bottom portion BS and the sidewall SW. Other components of the electronic device ED may also be accommodated in the case HS.

The case HS may include a material having a relatively high rigidity (e.g., a high modulus of elasticity). For example, the case HS may include a plurality of frames and/or plates formed of a glass, plastic, and/or metal material. The case HS may stably protect the components of the electronic device ED, which are accommodated in the inner space, from external impacts.

A receiving groove RG may be defined in the bottom portion BS to correspond to the air gap portion AGP. The receiving groove RG will be described in detail later with reference to FIGS. 13 and 14.

Figure 5:
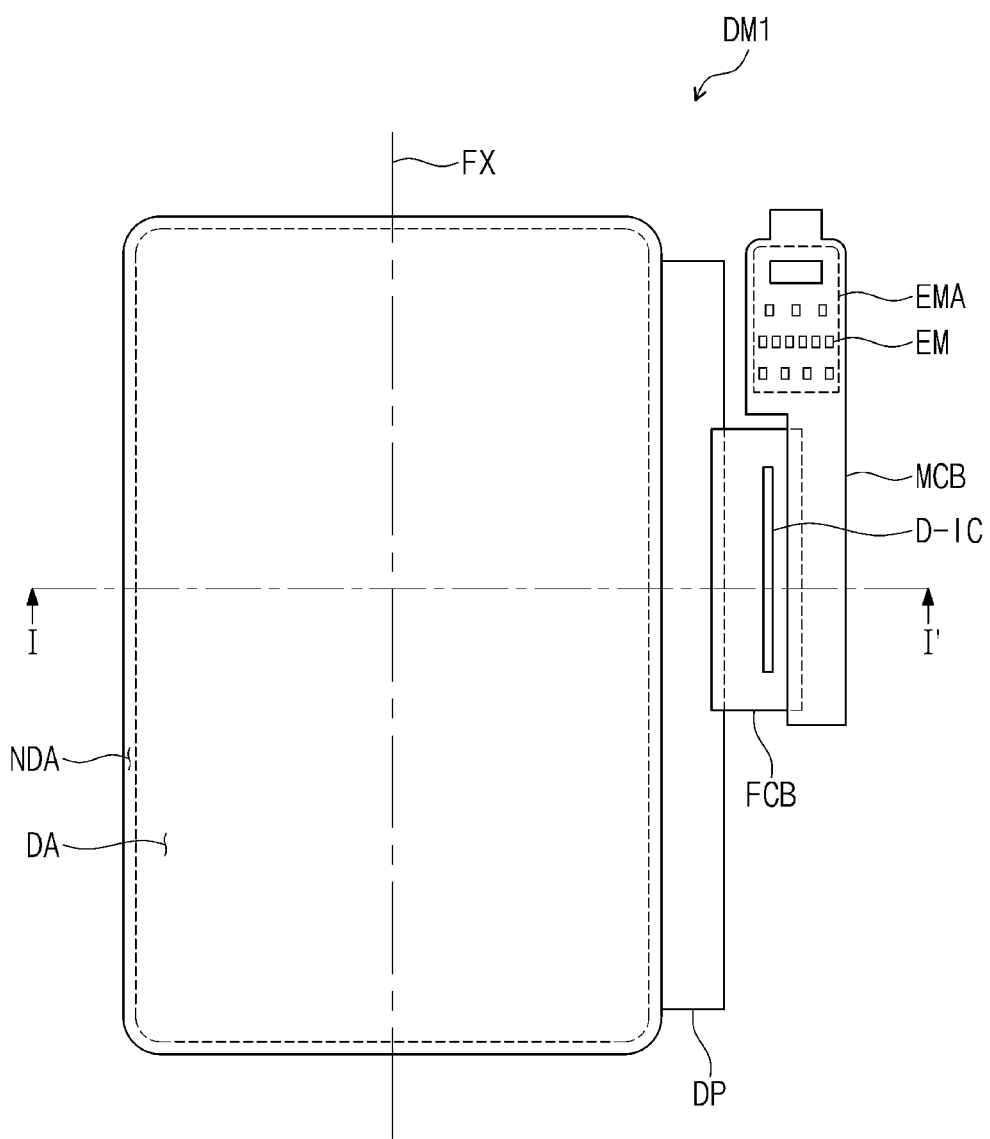
FIG. 5 is a plan view illustrating a display module shown in FIG. 3, according to an exemplary embodiment of the present invention.
Figure 6:
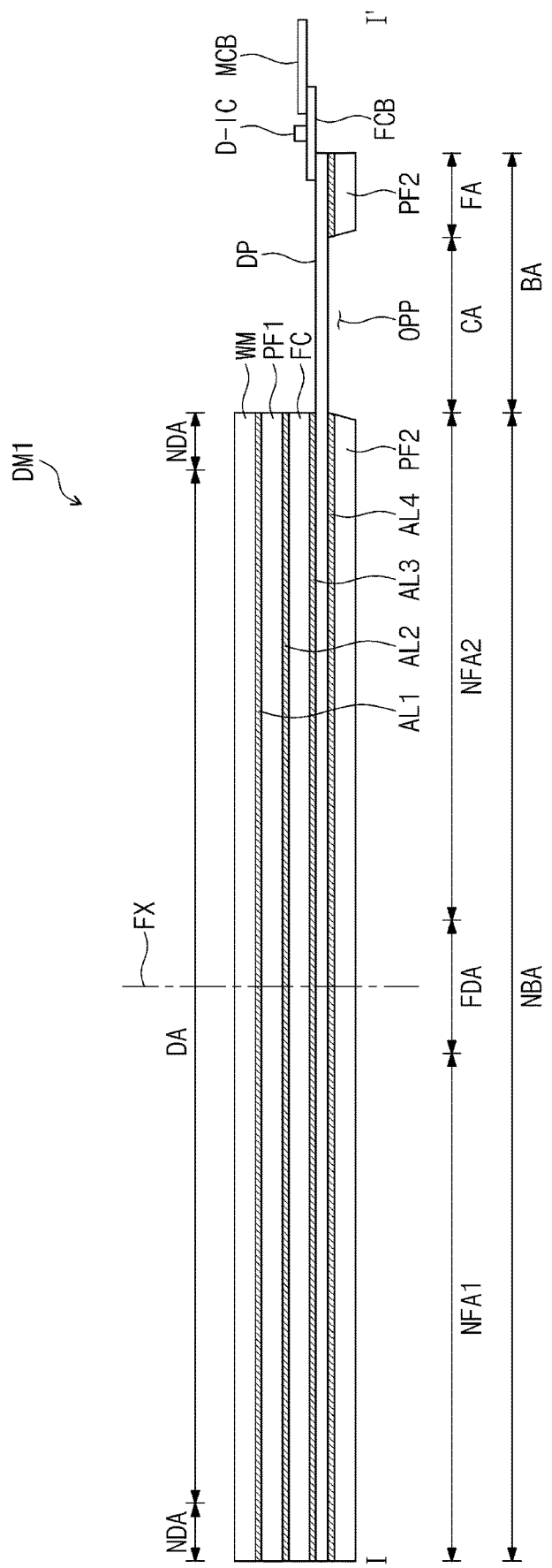
FIG. 6 is a cross-sectional view taken along a line I-I' shown in FIG. 5, according to an exemplary embodiment of the present invention.
Figure 7:
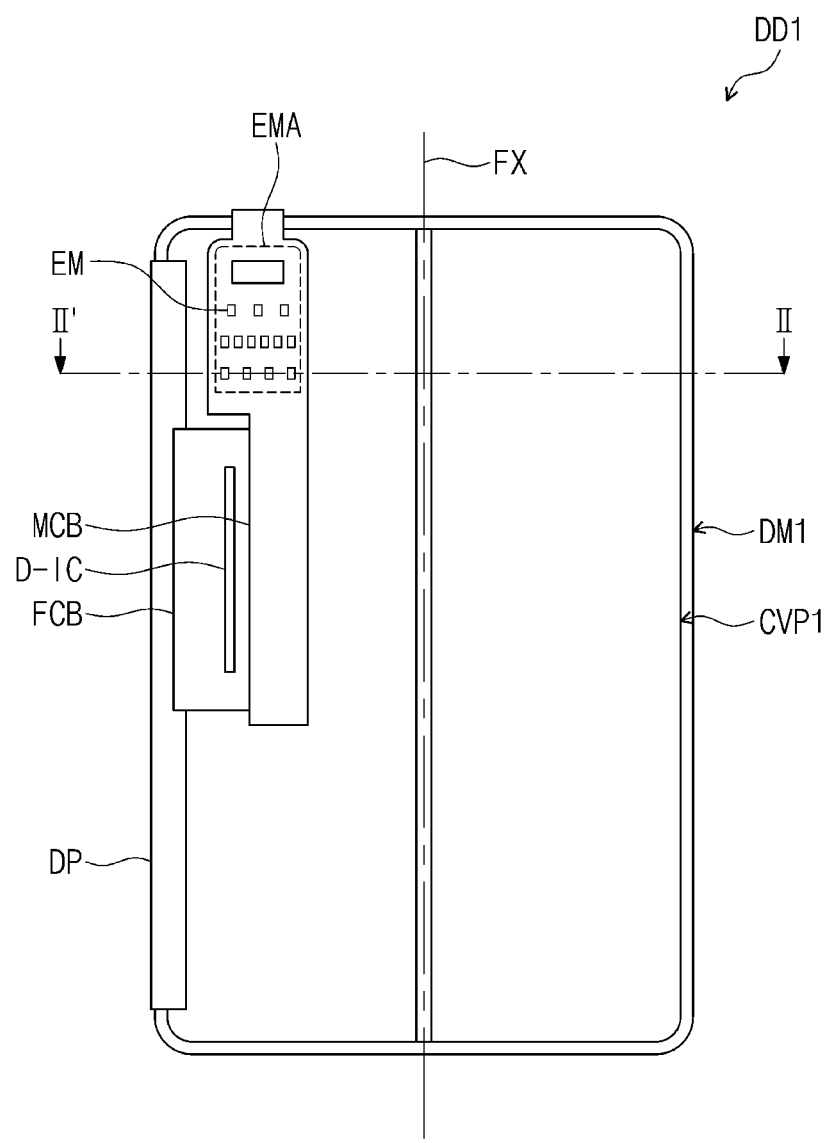
FIG. 7 is a plan view illustrating a rear surface of the display module shown in FIG. 3, according to an exemplary embodiment of the present invention.
Figure 8:
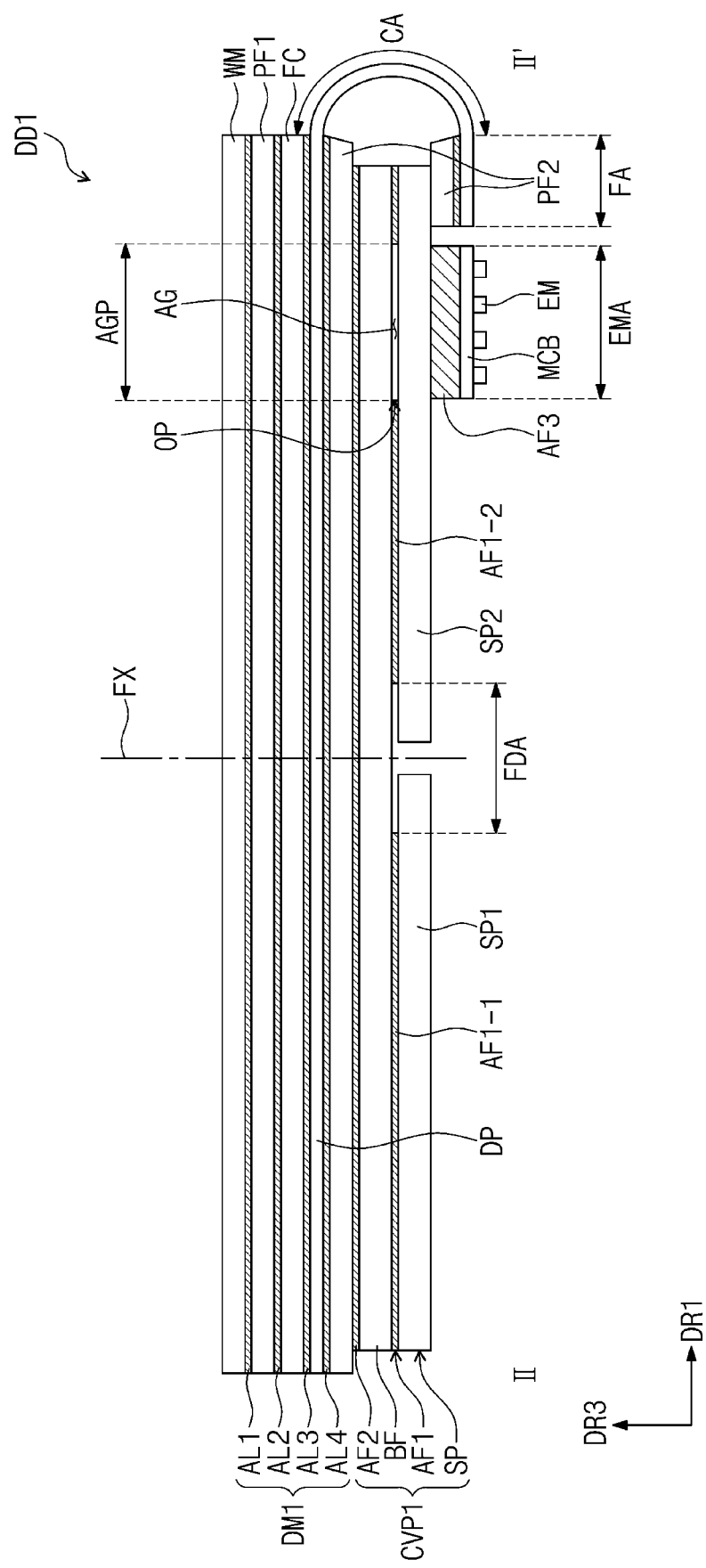
FIG. 8 is a cross-sectional view taken along a line II-II' shown in FIG. 7, according to an exemplary embodiment of the present invention.

FIG. 5 is a plan view illustrating the display module DM1 shown in FIG. 3, and FIG. 6 is a cross-sectional view taken along a line I-I' shown in FIG. 5. FIG. 7 is a plan view illustrating the rear surface of the display module DM1 shown in FIG. 3, and FIG. 8 is a cross-sectional view taken along a line II-II' shown in FIG. 7.

Referring to FIGS. 5 and 6, the display module DM1 may include the display panel DP displaying the image and the window WM disposed on the display panel DP.

The display panel DP may be a flexible display panel. Accordingly, the display panel DP may be folded or unfolded about the folding axis FX. According to an exemplary embodiment of the present invention, the display panel DP may be an organic light emitting display panel.

According to an exemplary embodiment of the present invention, the display module DM1 may further include an input sensing unit to sense an external input. The input sensing unit may be disposed on the display panel DP in the form of a panel. According to an exemplary embodiment of the present invention, the input sensing unit may be integrally formed with the display panel DP. For example, the input sensing unit may be directly disposed on a thin film encapsulation layer of the display panel DP. The input sensing unit will be described in detail later with reference to FIGS. 18 and 20.

An upper surface of the window WM defines the display surface IS of the electronic device ED. The window WM may include an optically clear material. Therefore, the image generated by the display panel DP may be observed by the user after passing through the window WM.

The window WM may include a flexible material. Accordingly, the window WM may be folded or unfolded about the folding axis FX. For example, the window WM may be a plastic plate and/or a resin film including an organic material.

One or more functional layers FC may be disposed between the display panel DP and the window WM. According to an exemplary embodiment of the present invention, the functional layer FC may be an anti-reflection layer that blocks external light reflection. The anti-reflection layer may prevent elements of the display panel DP from being observed by the user due to the external light incident through the front surface of the electronic device ED. The anti-reflection layer may include a polarization film and/or a retardation film. The number of the retardation films and a phase retardation length ($\lambda/4$ or $\lambda/2$) of the retardation film may be determined according to an operation principle of the anti-reflection layer.

A first protective film PF1 may be disposed between the functional layer FC and the window WM, and a second protective film PF2 may be disposed on the rear surface of the display panel DP. The first protective film PF1 may include a polymer material. The first protective film PF1 may absorb impacts applied from the outside to protect the display panel DP from the impacts.

Here, the window WM and the first protective film PF1 may be attached to each other by a first adhesive layer AL1. The first protective film PF1 may be attached to the functional layer FC by a second adhesive layer AL2, and the functional layer FC may be attached to the upper surface of the display panel DP by a third adhesive layer AL3.

In FIG. 6, the first protective film PF1 is disposed between the window WM and the functional layer FC, however, the present invention should not be limited thereto. For example, the first protective film PF1 may be disposed between the functional layer FC and the display panel DP or may be omitted.

The second protective film PF2 may include a polymer material. The second protective film PF2 may include the same material as the first protective film PF1. The material for the first and second protective films PF1 and PF2 is not limited to plastic resins and may include an organic/inorganic composite material. The first and second protective films PF1 and PF2 may include a porous organic layer and an inorganic material filled in pores of the organic layer. As an example of the present invention, the first and second protective films PF1 and PF2 may include a hydrophilic material.

The second protective film PF2 may be attached to the rear surface of the display panel DP by a fourth adhesive layer AL4. The first to fourth adhesive layers AL1 to AL4 may include an optically clear material. The first to fourth adhesive layers AL1 to AL4 may be an adhesive layer manufactured by coating a liquid adhesive material and curing the liquid adhesive material, or may be a separately manufactured adhesive sheet. For example, the first to fourth adhesive layers AL1 to AL4 may include a pressure sensitive adhesive (PSA), an optical clear adhesive (OCA), and/or an optical clear resin (OCR).

The display panel DP may be a flexible display panel, for example, an organic light emitting display panel. The display panel DP may include a bending area BA and a non-bending area NBA. The non-bending area NBA may be an area including the display area DA and the non-display area NDA of the display module DM1, and the bending area BA may include at least a portion of the display panel DP and may be bent. The folding area FDA and the first and second non-folding areas NFA1 and NFA2 of the display module DM1 may be included in the non-bending area NBA.

The display module DM1 may include a flexible circuit board FCB connected to the display panel DP and a driving chip D-IC mounted on the flexible circuit board FCB. The flexible circuit board FCB may be connected to a main circuit board MCB. Parts EM, such as a control chip, a plurality of passive elements, and a plurality of active elements, may be mounted on the main circuit board MCB. An area of the main circuit board MCB, in which the parts EM are mounted, may be defined as a part mounting area EMA. The main circuit board MCB may include a flexible film as the flexible circuit board FCB.

Referring to FIG. 7, the display module DM1 may have a larger planar area than a planar area of the cover panel CVP1, when viewed in a plan view. The display device DD1 may include a display panel DP with a rectangular shape including long and short sides. A first long side of the display panel DP may overlap both an edge of the display module DM1 and an adjacent edge of the cover panel CVP1. A second long side of the display panel DP may be disposed in parallel to the first long side and may have a first long side of the flexible circuit board FCB disposed thereon. The main circuit board MCB may be disposed on a second long side of the flexible circuit board FCB opposite to the first long side of the flexible circuit board FCB. A long side of the main circuit board MCB may be disposed on the flexible circuit board FCB, and may include a portion that extends beyond the second long side of the flexible circuit board FCB. The portion of the main circuit board MCB may include first and second protrusions which may be integrated with the portion, and may include the part mounting area EMA disposed on the integrated portion. The first protrusion may extend orthogonally from the long side of the main circuit board MCB and may have a shape that corresponds to a shape defined between a second long side of the display panel DP and an adjacent short side of the flexible circuit board FCB orthogonally extending therefrom. The second protrusion of the main circuit board MCB may extend from integrated adjacent short sides of the portion and the first protrusion and may overlap both an edge of the display module DM1 and an adjacent edge of the cover panel CVP1. The second protrusion may be affixed to a rear surface of the display device DD1. For example, the second protrusion may be coupled to a side of the display module DM1 by a locking or clipping means and/or an adhesive.

According to an exemplary embodiment of the present invention, a chip-on-film (COF) structure in which the driving chip D-IC is mounted on the flexible circuit board FCB is shown. In the COF structure depicted in the present embodiment, the display module DM1 may include two circuit boards FCB and MCB, however, the present invention should not be limited thereto. For example, the display module may have a chip-on-panel (COP) structure in which the driving chip D-IC is mounted on the display panel DP. The COP structure will be described in detail with reference to FIGS. 14 to 17.

The bending area BA may include a curvature area CA having a predetermined curvature in a bending state and a facing area FA facing the non-bending area NBA in the bending state. The curvature area CA is defined adjacent to the non-bending area NBA and may be substantially bent. The facing area FA is defined adjacent to the curvature area CA and might not not have the curvature. The facing area FA may face the non-bending area NBA and may be spaced apart from the non-bending area NBA. The facing area FA of the display panel DP may be connected to the flexible circuit board FCB.

The second protective film PF2 may be disposed to correspond to the non-bending area NBA and the facing area FA and might not be disposed in the curvature area CA. A bending opening portion OPP may be defined through the second protective film PF2 to correspond to the curvature area CA. The second protective film PF2 may be removed from the curvature area CA during a manufacturing step, thus a stress occurring in the curvature area CA during bending may be reduced. When the bending opening portion OPP is defined through the second protective film PF2, as an example, the fourth adhesive layer AL4 may also be removed corresponding to the bending opening portion OPP. Thus, a lower surface of the display panel DP may be exposed.

According to an embodiment of the present invention, the second protective film PF2 may be provided with a groove defined therein to correspond to the curvature area CA. For example, the second protective film PF2 may be formed thinner in the curvature area CA than the non-bending area NBA and the facing area FA.

Referring to FIGS. 7 and 8, the cover panel CVP1 may be disposed on the rear surface of the display module DM1. The cover panel CVP1 may include the support plate SP. In the case where the display module DM has one folding axis FX, the support plate SP may include two support plates SP1 and SP2. However, when the number of the folding axes FX increases, the support plate SP may include a plurality of support plates separated from each other with respect to the folding axis. The first and second support plates SP1 and SP2 may be disposed to correspond to the non-bending area NBA.

When the curvature area CA of the display module DM1 is bent, the facing area FA faces the non-bending area NBA, and the flexible circuit board FCB connected to the facing area FA and the main circuit board MCB are disposed substantially in parallel to the non-bending area NBA of the display panel DP. The first and second support plates SP1 and SP2 may be disposed to overlap with the non-bending area NBA. In addition, the flexible circuit board FCB and the main circuit board MCB may be disposed on a rear surface of the second support plate SP2 after the curvature area CA is bent. According to an exemplary embodiment of the present invention, the flexible printed circuit board FCB and the main circuit board MCB may remain disposed on a rear surface of the second support plate SP2 even after the folding area FDA is folded. For example, the display device DD1 may further include a third adhesive film AF3 to attach the flexible circuit board FCB and the main circuit board MCB to the second support plate SP2. Accordingly, the flexible circuit board FCB and the main circuit board MCB may be fixed to the rear surface of the second support plate SP2.

The first and second support plates SP1 and SP2 may be fixed to a rear surface of the buffer film BF by the first and second sub-adhesive films AF1-1 and AF1-2. The support plate SP may be attached to the rear surface of the buffer film BF by the first adhesive film AF1.

The first and second sub-adhesive films AF1-1 and AF1-2 may be spaced apart from each other in the folding area FDA. For example, the first and second sub-adhesive films AF1-1 and AF1-2 might not have lengths in the first direction (e.g., the DR1 direction) that extend into the folding area FDA. The first and second sub-adhesive films AF1-1 and AF1-2 therefore might not overlap with the folding area FDA. For example, the lengths of the first and second sub-adhesive films AF1-1 and AF1-2 in the first direction (e.g., the DR1 direction) may each be less than the length of respective first and second support plates SP1 and SP2. The first and second support plates SP1 and SP2 may partially overlap the folding area FDA and may have adjacent ends facing one another that are each spaced apart from the folding axis FX in a first direction (e.g., the DR1 direction). Therefore, in the folded state of the display device DD1, the portion of the first support plate SP1 in the folding area FDA may be spaced apart from the buffer film BF, and the portion of the second support plate SP2 in the folding area FDA may be spaced apart from the buffer film BF.

The air gap portion AGP is defined as an area in which the air gap AG is defined. The air gap AG is defined between the buffer film BF and the second support plate SP2 by the opening OP. In particular, the air gap AG is formed between the buffer film BF and the second support plate SP2 by the opening OP formed by removing the portion of the second sub-adhesive film AF1-2.

The air gap portion AGP may be defined to correspond to the part mounting area EMA of the main circuit board MCB. For example, the air gap portion AGP may have a width in the first direction (e.g., the DR1 direction) that is substantially equal to a width of the part mounting area EMA in the first direction (e.g., the DR1 direction). The air gap portion AGP may overlap the part mounting area EMA of the main circuit board MCB in the third direction (e.g., the DR3 direction). The air gap portion AGP may overlap the part mounting area EMA such that the parts mounted in the part mounting area EMA are located inside the area in which the air gap portion AGP is disposed.

According to an exemplary embodiment of the present invention, the second support plate SP2 may have a portion recessed from a rear surface thereof that corresponds to a shape of the opening OP. The third adhesive film AF3 may be disposed on a bottom of the recessed portion and may be at least partially overlapped by the second support plate SP2 in the first direction (e.g., the DR1 direction) and/or the second direction (e.g., the DR2 direction).

Although the support plate SP may be deformed in the part mounting area EMA, the deformation may not be transmitted to the buffer film BF and the display module DM1 due to the air gap AG. Thus, the deformation of the support plate SP caused by the external impacts may be prevented from leading to deformation of the display module DM1 thereby also increasing product reliability.

Figure 9:
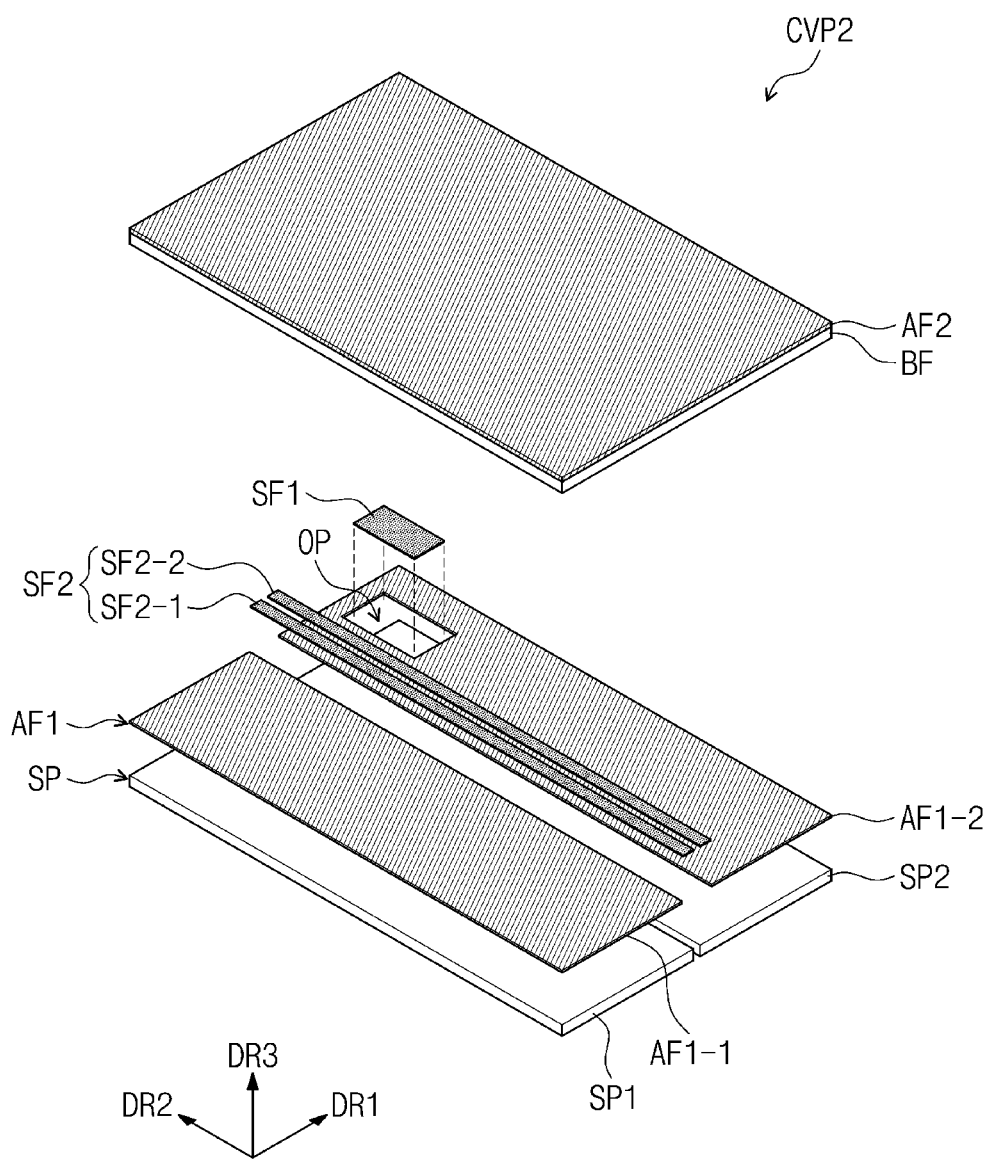
FIG. 9 is an exploded perspective view illustrating a cover panel, according to an exemplary embodiment of the present invention.
Figure 10:
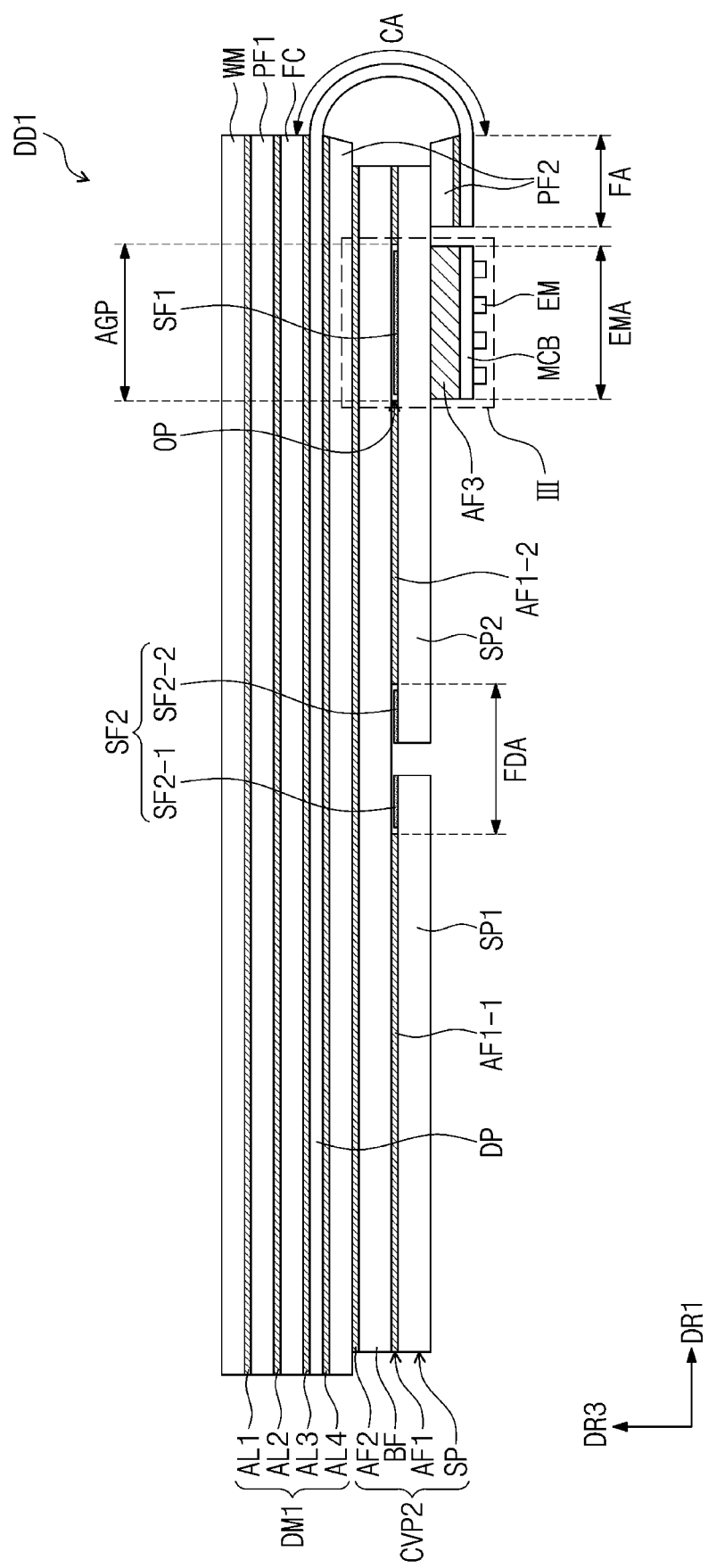
FIG. 10 is a cross-sectional view illustrating a display device including the cover panel shown in FIG. 9, according to an exemplary embodiment of the present invention.
Figure 11:
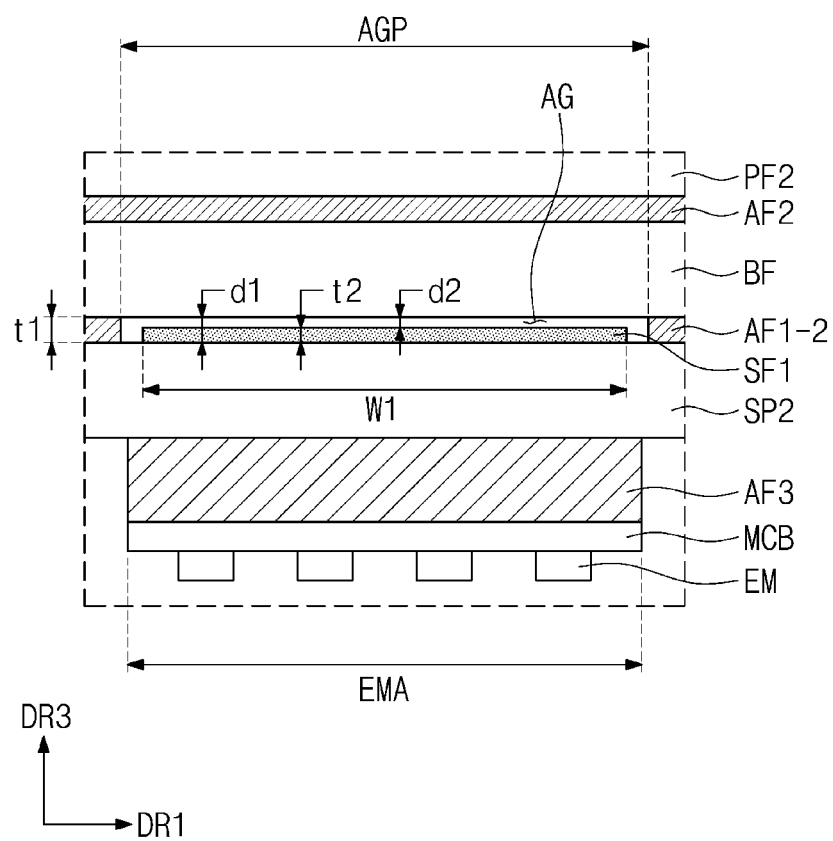
FIG. 11 is an enlarged cross-sectional view illustrating a portion III of FIG. 10, according to an exemplary embodiment of the present invention.

FIG. 9 is an exploded perspective view illustrating a cover panel CVP2 according to an exemplary embodiment of the present invention, FIG. 10 is a cross-sectional view illustrating a display device DD1 including the cover panel CVP2 shown in FIG. 9, and FIG. 11 is an enlarged cross-sectional view of a portion III of FIG. 10. In FIGS. 9 to 11, the same reference numerals denote the same elements in FIGS. 1 to 8, and thus detailed descriptions thereof will be omitted for brevity.

Referring to FIGS. 9 to 11, the cover panel CPV2 according to an exemplary embodiment of the present invention is disposed under a display module DM1. The cover panel CVP2 may be coupled to a rear surface of the display module DM1. The cover panel CPV2 may support the rear surface of the display module DM1. The cover panel CVP2 may have a structure in which a plurality of layers is stacked in the third direction (e.g., the DR3 direction). An air gap portion AGP may be defined in the cover panel CVP2 separating at least two layers among the layers from each other.

The cover panel CPV2 according to an exemplary embodiment of the present invention may further include a first step difference film SF1 corresponding to the air gap portion AGP. An opening OP may be formed by removing a portion of a second sub-adhesive film AF1-2. The air gap portion AGP is provided between a buffer film BF and a second support plate SP2 by the opening OP. The buffer film BF and the second support plate SP2 are spaced apart from each other by a first distance d1 in the air gap portion AGP.

The first step difference film SF1 may be disposed between the second support plate SP2 and the buffer film BF to correspond to the opening OP. The first step difference film SF1 may have a width W1 extending in the first direction (e.g., the DR1 direction) smaller than the opening OP. The first step difference film SF1 may be disposed in the opening OP. For example, the first step difference film SF1 may be disposed on a front surface of the second support plate SP2. The first step difference film SF1 may be at least partially surrounded by the second sub-adhesive film AF1-2. For example, the first step difference film SF1 may have sidewalls extended in the third direction (e.g., the DR3 direction) that overlap respective sidewalls of the second sub-adhesive film AF1-2 in the first direction (e.g., the DR1 direction).

The first step difference film SF1 may be fixed to the second support plate SP2. The first step difference film SF1 may include an adhesive tape attached to the upper surface of the second support plate SP2 to correspond to the opening OP. The display module DM1 may be supported by the first step difference film SF1 in the air gap portion AGP.

The first step difference film SF1 may have a thickness in the third direction (e.g., the DR3 direction) smaller than that of the first adhesive film AF1. When the first adhesive film AF1 has a first thickness t1, the first step difference film SF1 has a second thickness t2 smaller than the first thickness t1. For example, the first thickness t1 may be about 25 micrometers (μm), and the second thickness t2 may be about 20 micrometers (μm). However, the first and second thicknesses t1 and t2 should not be limited thereto. For example, the first and second thicknesses t1 and t2 may be variously changed as long as the second thickness t2 is smaller than the first thickness t1.

Since the first step difference film SF1 has the thickness smaller than that of the first adhesive film AF1, the first step difference film SF1 and the buffer film BF may be spaced apart from each other by a second distance d2 in the third direction (e.g., the DR3 direction). For example, an air gap AG may be formed between the first step difference film SF1 and the buffer film BF and may correspond to the part mounting area EMA. For example, the air gap AG may occupy the difference in area between the air gap portion AGP and the first step difference film SF1.

According to an exemplary embodiment of the present invention, the first step difference film SF1 may be disposed on a rear surface of the buffer film BF with the air gap AG disposed therebetween.

Even though the support plate SP may be deformed in the part mounting area EMA, the deformation is not transmitted to the buffer film BF and the display module DM1 due to the air gap AG. Thus, the deformation of the support plate SP caused by the external impacts may be prevented from leading to deformation of the display module DM1.

The cover panel CVP2, according to an exemplary embodiment of the present invention, may further include a second step difference film SF2 corresponding to the folding area FDA. The second step difference film SF2 may include first and second sub-step difference films SF2-1 and SF2-2. The first sub-step difference film SF2-1 may be interposed between the first support plate SP1 and the buffer film BF in the folding area FDA, and the second sub-step difference film SF2-2 may be interposed between the second support plate SP2 and the buffer film BF in the folding area FDA.

The first and second sub-step difference films SF2-1 and SF2-2 are respectively fixed to the first and second support plates SP1 and SP2. The first and second sub-step difference films SF2-1 and SF2-2 may include adhesive tapes respectively attached to upper surfaces of the first and second support plates SP1I and SP2.

When the display module DM1 is in the unfolded state, the folding area FDA of the display module DM1 may be supported by the first and second sub-step difference films SF2-1 and SF2-2. When the display module DM1 is in the folded state, the first and second sub-step difference films SF2-1 and SF2-2 may be spaced apart from the buffer film BF.

Accordingly, the first and second sub-step difference films SF2-1 and SF2-2 may prevent the display module DM1 from sagging in the folding area FDA.

Figure 12:
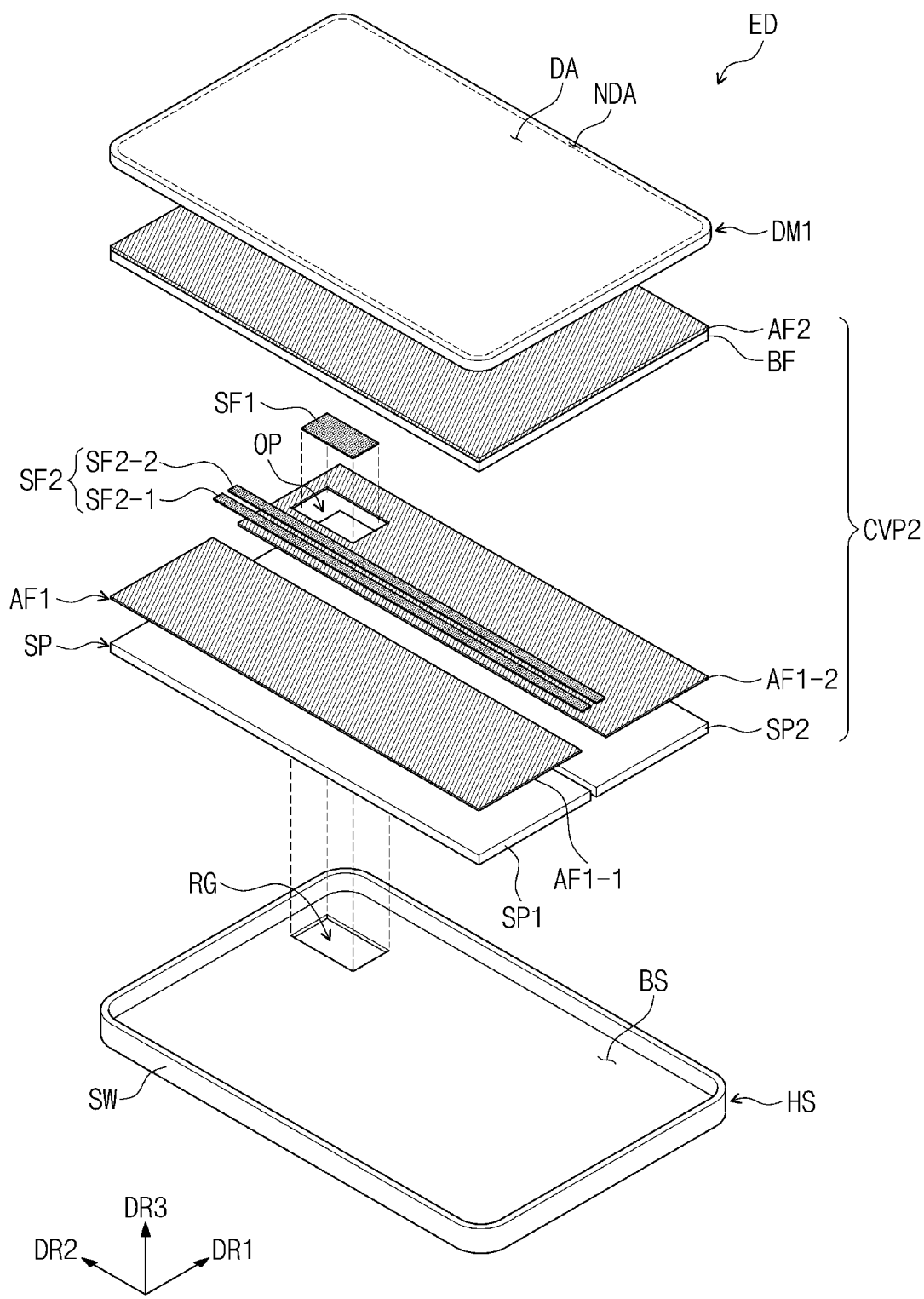
FIG. 12 is an exploded perspective illustrating an electronic device including the cover panel shown in FIG. 9, according to an exemplary embodiment of the present invention.
Figure 13:
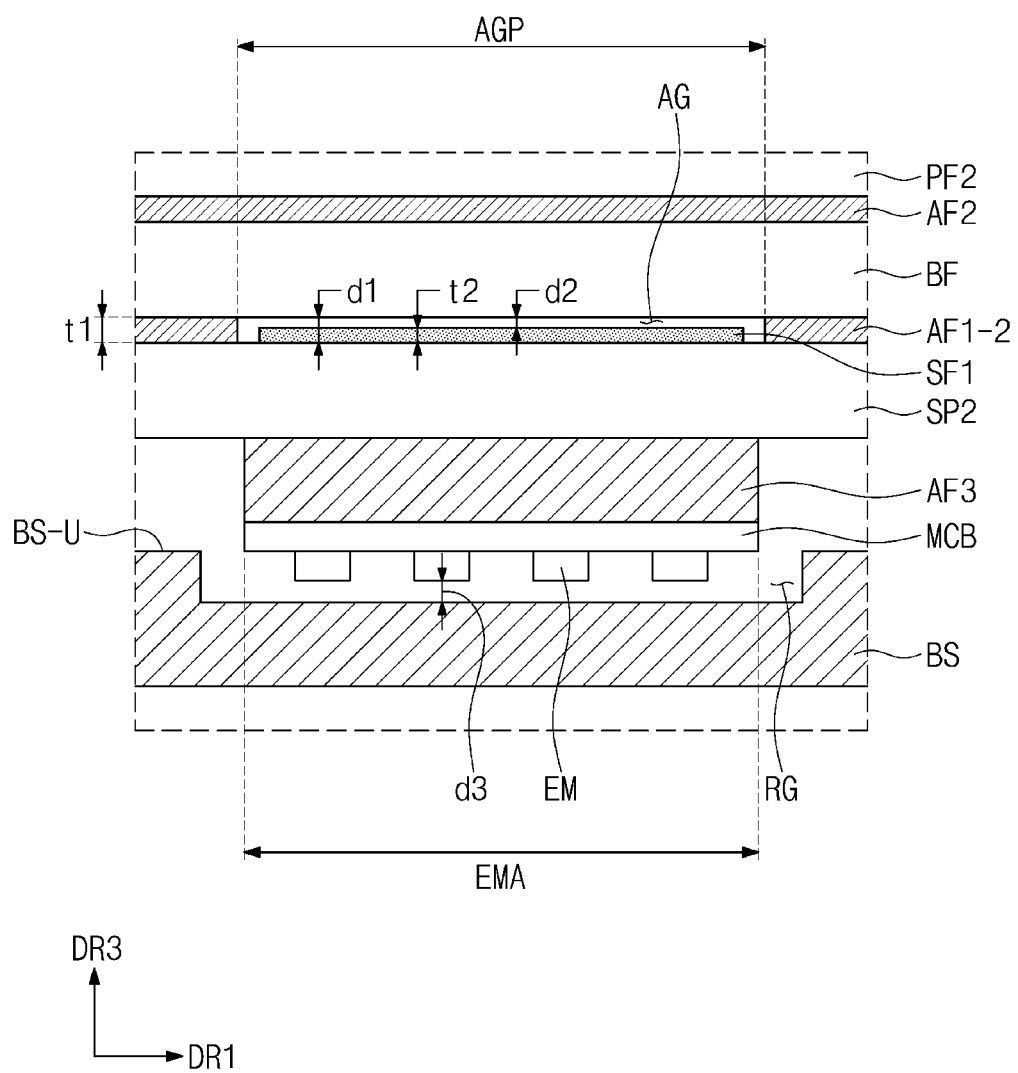
FIG. 13 is an enlarged cross-section illustrating a portion of FIG. 12, according to an exemplary embodiment of the present invention.

FIG. 12 is an exploded perspective view illustrating an electronic device ED including the cover panel CVP2 shown in FIG. 9 according to an exemplary embodiment of the present invention, and FIG. 13 is an enlarged cross-sectional view illustrating a portion of FIG. 12.

Referring to FIGS. 12 and 13, the electronic device ED may include the case HS covering the display device DD1. The case HS may include the bottom portion BS and the sidewall SW extending from the bottom portion BS, and the display device DD1 may be accommodated in the inner space defined by the bottom portion BS and the sidewall SW.

The receiving groove RG may be defined in the bottom portion BS to correspond to the air gap portion AGP. The receiving groove RG may be formed by being recessed from an upper surface BS-U of the bottom portion BS.

The receiving groove RG may be defined to correspond to the part mounting area EMA of the main circuit board MCB. The receiving groove RG may overlap with the part mounting area EMA of the main circuit board MCB. The parts EM of the main circuit board MCB may be accommodated in the receiving groove RG. The parts EM of the main circuit board MCB may be mounted on the upper surface of the main circuit board MCB, and thus may protrude from the upper surface of the main circuit board MCB by a predetermined height in the third direction (e.g., the DR3 direction). Since the thickness of the electronic device ED may increase due to the protruding height of the parts EM, the receiving groove RG may be defined to accommodate the parts EM. A gap d3 may be provided between the bottom portion defining the receiving groove RG and the parts EM. As described above, when the gap d3 is provided, the support plate SP may be deformed by external impacts in the part mounting area EMA.

However, as shown in FIGS. 1 to 13, the second support plate SP2 and the buffer film BF may be spaced apart from each other by the air gap portion AGP. For example, the deformation of the support plate SP is not transmitted to the buffer film BF and the display module DM1 due to the air gap portion AGP. Thus, the deformation of the support plate SP caused by the external impacts may be prevented from leading to the deformation of the display module DM1.

Although the first step difference film SF1 is interposed between the second support plate SP2 and the buffer film BF to correspond to the air gap portion AGP, the second support plate SP2 and the buffer film BF may be spaced apart from each other by a predetermined distance d2 (refer to FIGS. 11 and 13). Therefore, even though the external impacts are applied, the deformation of the support plate SP may be prevented from leading to the deformation of the display module DM1, and the buffer film BF and the display module DM1 may be supported by the first step difference film SF1 in the air gap portion AGP.

Figure 14:
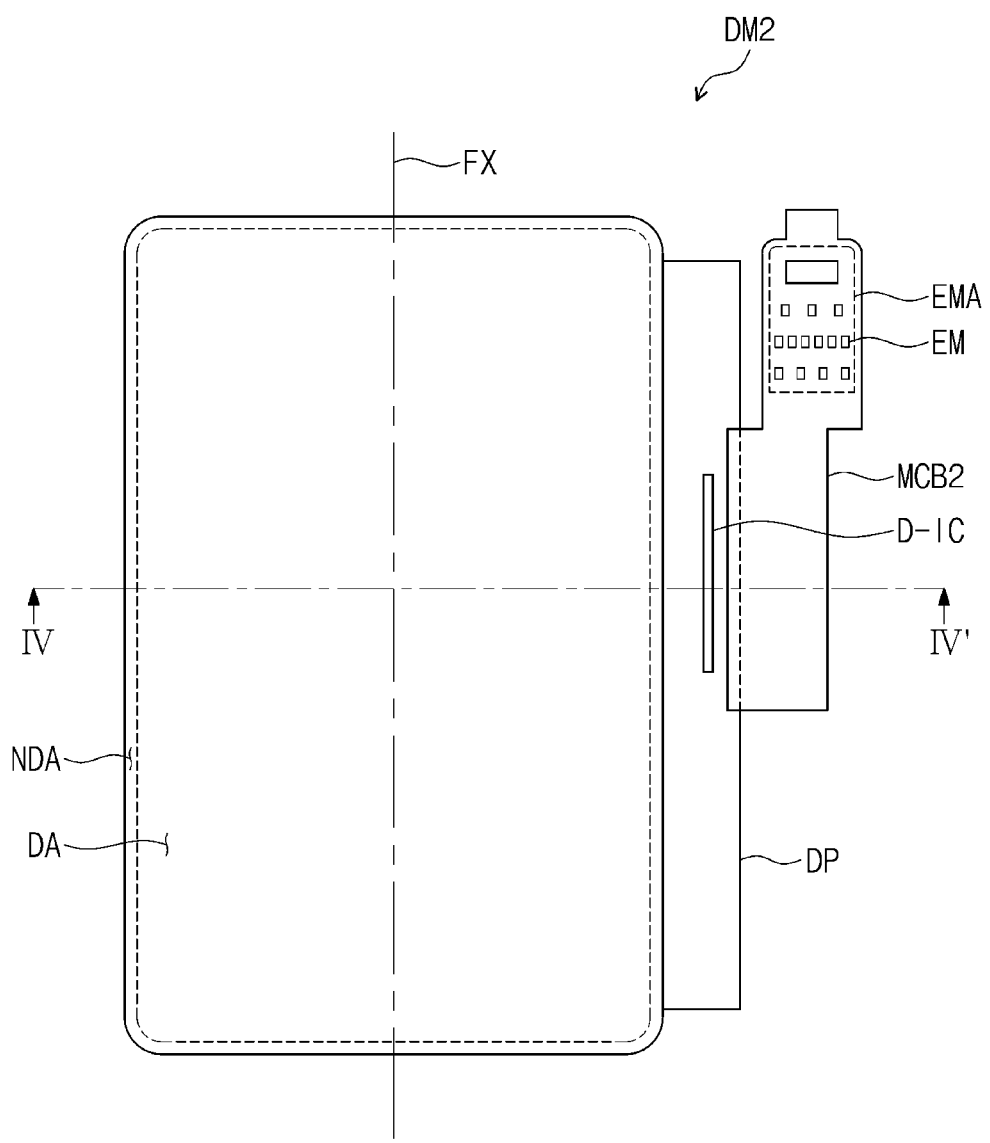
FIG. 14 is a plan view illustrating a display module, according to an exemplary embodiment of the present invention.
Figure 15:
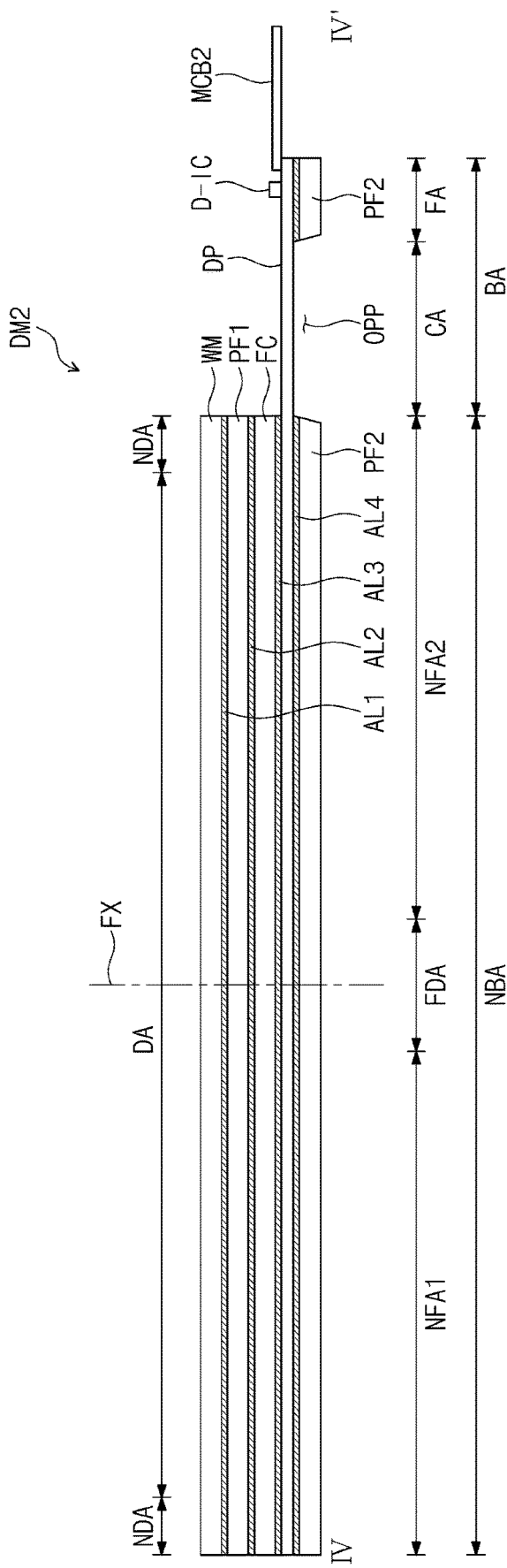
FIG. 15 is a cross-sectional view illustrating a cross-section taken along a line IV-IV' shown in FIG. 14, according to an exemplary embodiment of the present invention.
Figure 16:
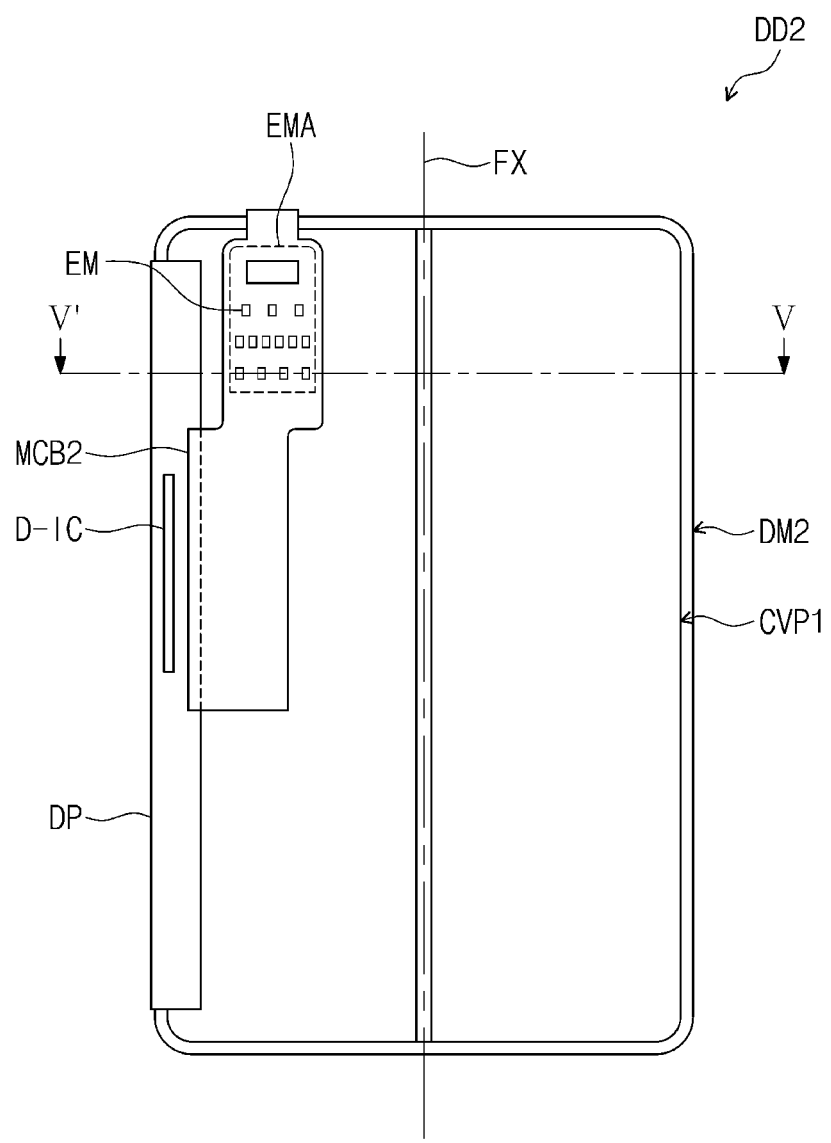
FIG. 16 is a plan view illustrating a rear surface of the display module shown in FIG. 14, according to an exemplary embodiment of the present invention.
Figure 17:
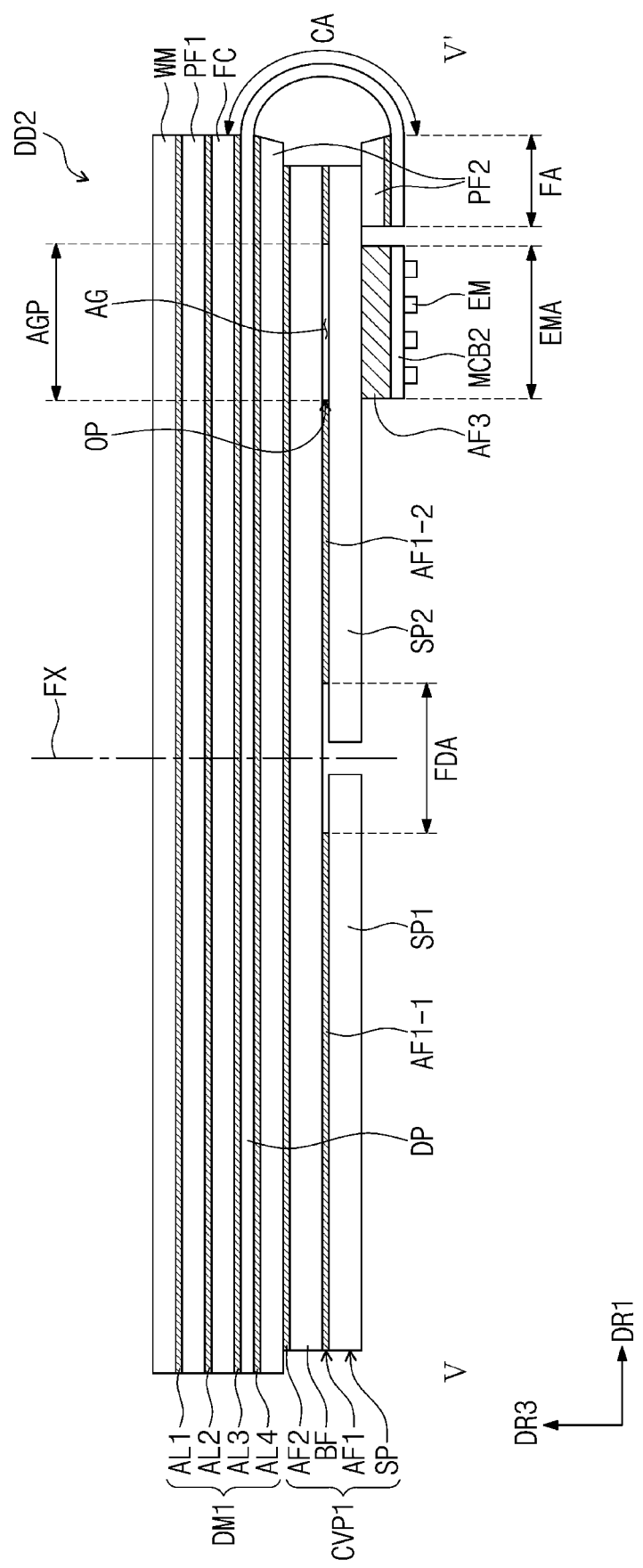
FIG. 17 is a cross-sectional view taken along a line V-V' shown in FIG. 16, according to an exemplary embodiment of the present invention.

FIG. 14 is a plan view illustrating a display module DM2 according to an exemplary embodiment of the present invention, and FIG. 15 is a cross-sectional view taken along a line IV-IV' shown in FIG. 14. FIG. 16 is a plan view illustrating a rear surface of the display module DM2 shown in FIG. 14, and FIG. 17 is a cross-sectional view taken along a line V-V' shown in FIG. 16. In FIGS. 14 to 17, the same reference numerals may denote the same elements as in FIGS. 5 to 8, and thus detailed descriptions thereof will be omitted for brevity.

Hereinafter, the COP structure will be described with reference to FIGS. 14 to 17.

Referring to FIGS. 14 to 17, the display module DM2, according to an exemplary embodiment of the present invention, may include a driving chip D-IC mounted on the display panel DP and a main circuit board MCB2 connected to the display panel DP.

The main circuit board MCB2 may be attached to one side of the display panel DP. The display panel DP may include a bending area BA and a non-bending area NBA. The main circuit board MCB2 may be attached to the bending area BA of the display panel DP.

The bending area BA may include a curvature area CA having a predetermined curvature in a bending state and a facing area FA facing the non-bending area NBA in the bending state. The curvature area CA may be defined adjacent to the non-bending area NBA and may be substantially bent. The facing area FA may be defined adjacent to the curvature area CA and might not have the curvature. The facing area FA faces the non-bending area NBA and is spaced apart from the non-bending area NBA.

The driving chip D-IC may be mounted on the facing area FA of the display panel DP, and the main circuit board MCB2 may be attached to the facing area FA. For example, the main circuit board MCB2 may be disposed on a front surface of the display panel DP in the facing area FA adjacent to the driving chip D-IC.

Parts EM, such as a control chip, a plurality of passive elements, and a plurality of active elements, may be mounted on the main circuit board MCB2. An area of the main circuit board MCB2, in which the parts EM are mounted, may be defined as a part mounting area EMA. The main circuit board MCB2 may include a flexible film.

Referring to FIGS. 16 and 17, the cover panel CVP1 may be disposed on a rear surface of the display module DM2. When the curvature area CA of the display module DM2 is bent, the facing area FA faces the non-bending area NBA. The main circuit board MCB2 connected to the facing area FA may be disposed substantially in parallel to the non-bending area NBA of the display panel DP. The main circuit board MCB2 may be disposed on a rear surface of the second support plate SP2 after the display module DM2 is bent.

The display device DD2 may further include the third adhesive film AF3 to attach the main circuit board MCB2 to the second support plate SP2. Accordingly, the main circuit board MCB2 may be fixed to the rear surface of the second support plate SP2.

The first and second support plates SP1 and SP2 may be fixed to the rear surface of the buffer film BF by the first and second sub-adhesive films AF1-1 and AF1-2. The support plate SP may be attached to the rear surface of the buffer film BF by the first adhesive film AF1.

The air gap portion AGP may be refer to an area in which the air gap AG is defined. The air gap AG may be defined between the buffer film BF and the second support plate SP2 in the opening OP. In particular, the air gap AG may be formed between the buffer film BF and the second support plate SP2 by the opening OP formed by removing the portion of the second sub-adhesive film AF1-2. The air gap portion AGP may correspond to the part mounting area EMA of the main circuit board MCB2. The air gap portion AGP may overlap with the part mounting area EMA of the main circuit board MCB2 in the third direction (e.g., the DR3 direction).

The support plate SP and the buffer film BF may be spaced apart from each other by the air gap AG. For example, the deformation of the support plate SP is not transmitted to the buffer film BF and the display module DM2 due to the air gap AG. Thus, the deformation of the support plate SP caused by the external impacts may be prevented from leading to the deformation of the display module DM2.

Figure 18:
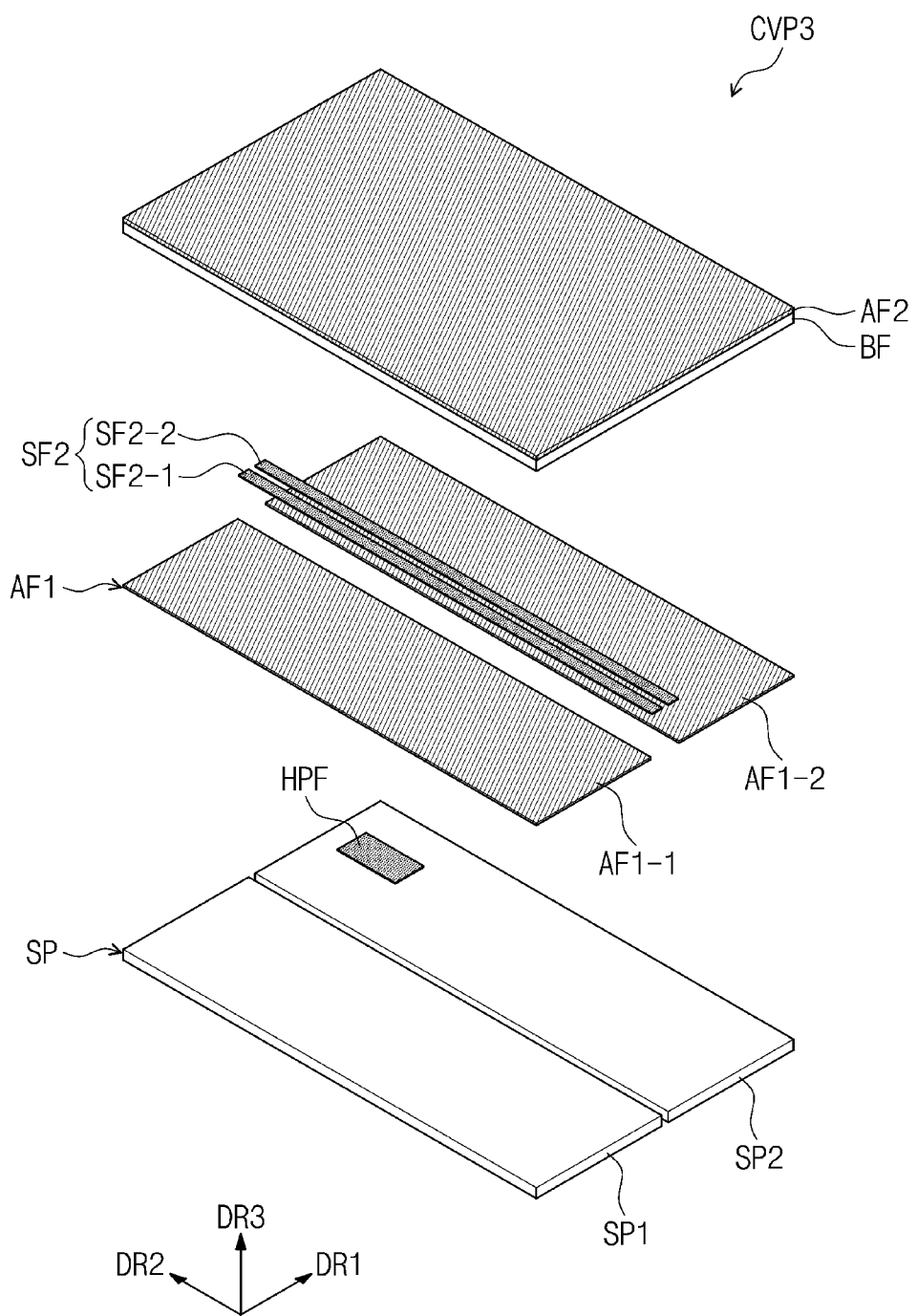
FIG. 18 is an exploded perspective view illustrating a cover panel, according to an exemplary embodiment of the present invention.
Figure 19:
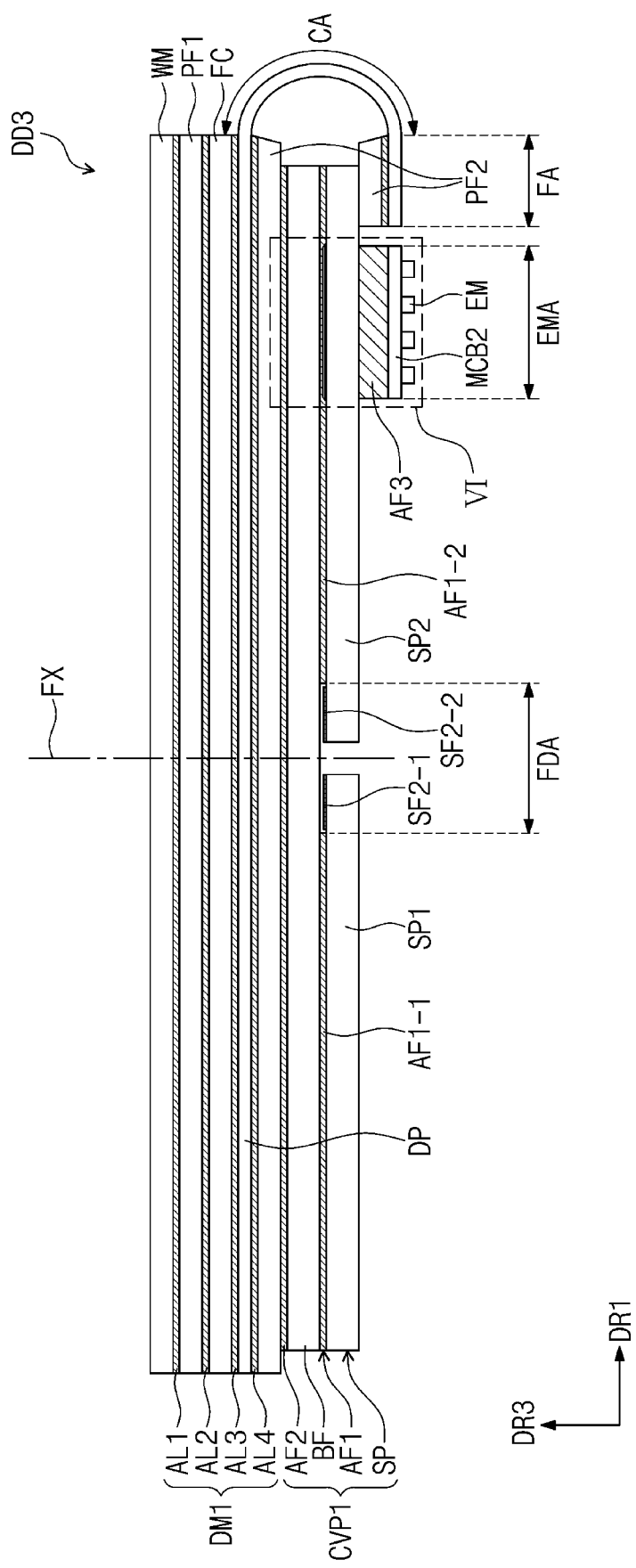
FIG. 19 is a cross-sectional view illustrating a display device including the cover panel shown in FIG. 18, according to an exemplary embodiment of the present invention.
Figure 20:
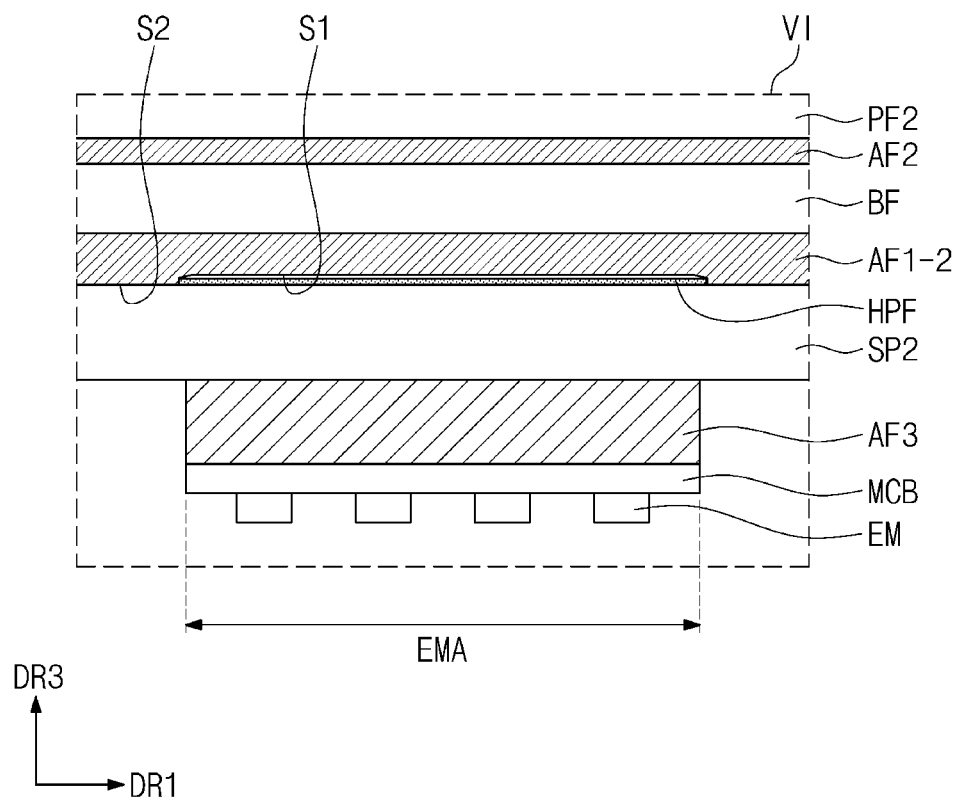
FIG. 20 is an enlarged cross-sectional view illustrating a portion VI of FIG. 19, according to an exemplary embodiment of the present invention.

FIG. 18 is an exploded perspective view illustrating a cover panel CVP3 according to an exemplary embodiment of the present invention, FIG. 19 is a cross-sectional view illustrating a display device DD3 including the cover panel CVP3 shown in FIG. 18, and FIG. 20 is an enlarged cross-sectional view of a portion VI of FIG. 19. In FIGS. 18 to 20, the same reference numerals may denote the same elements as described in reference to FIGS. 1 to 17, and thus detailed descriptions thereof will be omitted for brevity.

Referring to FIGS. 18 and 19, the cover panel CVP3 according to an exemplary embodiment of the present invention may be disposed under the display module DM1. For example, the cover panel CVP3 may be coupled to a rear surface of the display module DM1. The cover panel CVP3 may support the rear surface of the display module DM1. The cover panel CVP3 may have a structure in which a plurality of layers are stacked in the third direction (e.g., the DR3 direction). An adhesiveness of the adhesive film interposed between at least two layers among the layers of the cover panel CVP3 may be lost to prevent the at least two layers from being tightly attached in at least the part mounting area EMA.

The cover panel CVP3 may include a buffer film BF and a support plate SP. The support plate SP may be attached to a rear surface of the buffer film BF by a first adhesive film AF1. According to an exemplary embodiment of the present invention, the support plate SP may include first and second support plates SP1 and SP2 separated from each other in the first direction (e.g., the DR1 direction) with respect to the folding axis FX. A first adhesive film AF1 may include first and second sub-adhesive films AF1-1 and AF1-2. The first sub-adhesive film AF1-1 may attach the first support plate SP1 to the buffer film BF, and the second sub-adhesive film AF1-2 may attach the second support plate SP2 to the buffer film BF.

Different from the embodiments shown in FIGS. 1 to 17, the opening OP corresponding to the part mounting area EMA might not be defined in the second sub-adhesive film AF1-2 according to the exemplary embodiment of the present invention shown in FIG. 18. For example, the portion of the second sub-adhesive film AF1-2, which corresponds to the part mounting area EMA, might not be removed.

According to FIGS. 18 to 20, the cover panel CVP3 may further include a hydrophobic material layer HPF coated on the second support plate SP2 corresponding to the part mounting area EMA. As an example of the present invention, the hydrophobic material layer HPF may be formed on an upper surface (i.e., a surface facing the buffer film BF) of the second support plate SP2. The hydrophobic material layer HPF may be formed by depositing, coating, and/or spraying a hydrophobic material. According to an example of the present invention, the hydrophobic material may include a fluorine-based compound, however, it should not be limited thereto.

An adhesive force between the second support plate SP2 and the second sub-adhesive film AF1-2 may be weakened due to the hydrophobic material layer HPF disposed in the part mounting area EMA. A surface S1 of the second sub-adhesive film AF1-2, which makes contact with the hydrophobic material layer HPF (e.g., a rear surface of the hydrophobic material layer HPF), might not be tightly attached to the hydrophobic material layer HPF since the adhesiveness of the surface S1 is lost. However, since a surface S2 of the second sub-adhesive film AF1-2, may contact the second support plate SP2, which retains adhesive strength, the surface S2 may be attached to the second support plate SP2. The hydrophobic material layer HPF and the second sub-adhesive film AF1-2 may be spaced apart from each other by hundreds of nanometers to thousands of nanometers since the adhesive force between the hydrophobic material layer HPF and the second sub-adhesive film AF1-2 is relatively weak compared with the adhesive force between the surface S2 and the second support plate SP2.

As an example of the present invention, the hydrophobic material layer HPF may be correspond to the part mounting area EMA. For example, the hydrophobic material layer HPF may overlap with the part mounting area EMA of the main circuit board MCB2. Since the adhesiveness of the second sub-adhesive film AF1-2 with respect to the second support plate SP2 is lost by the hydrophobic material layer HPF in the part mounting area EMA, the second support plate SP2 and the buffer film BF may not be attached to each other in the part mounting area EMA. Accordingly, the deformation of the second support plate SP2 is not transmitted to the buffer film BF and the display module DM1. Therefore, the deformation of the second support plate SP2 caused by the external impacts may be prevented from leading to the deformation of the display module DM1.

Figure 21:
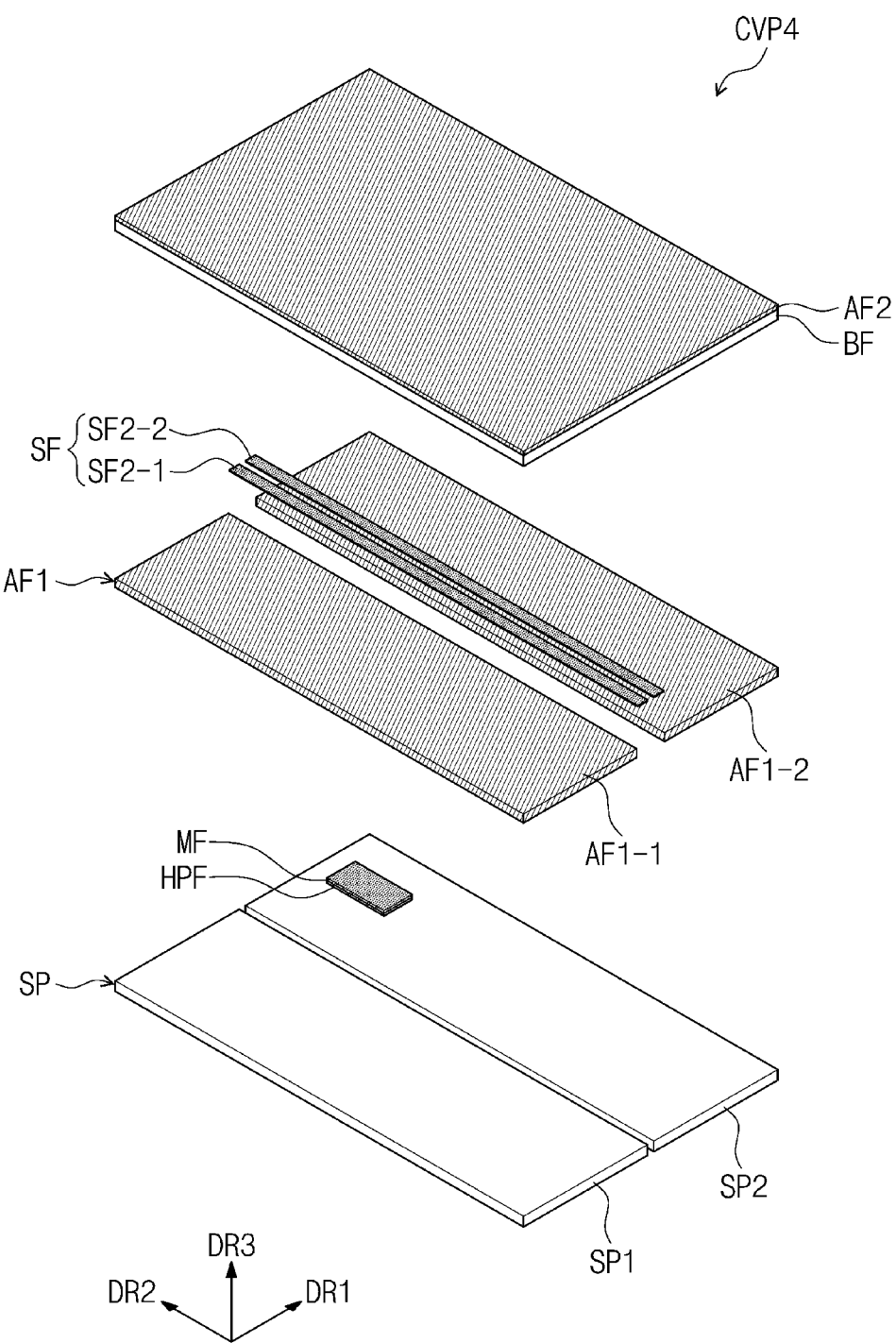
FIG. 21 is an exploded perspective view illustrating a cover panel, according to an exemplary embodiment of the present invention.
Figure 22:
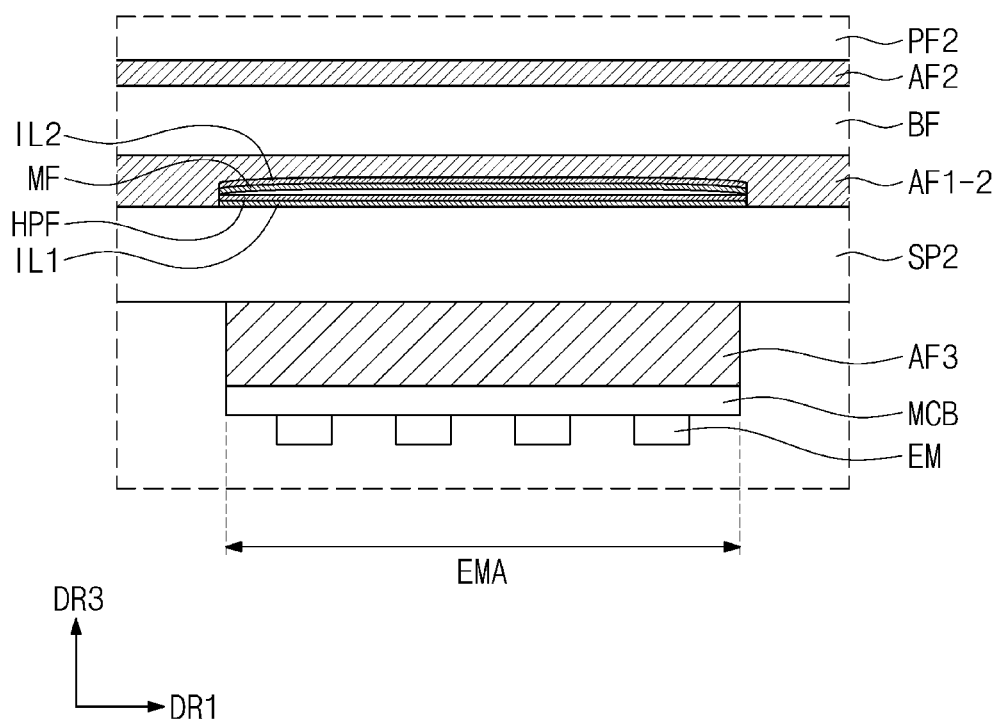
FIG. 22 is an enlarged cross-sectional view illustrating the cover panel shown in FIG. 21, according to an exemplary embodiment of the present invention.

FIG. 21 is an exploded perspective view illustrating a cover panel CVP4 according to an exemplary embodiment of the present invention, and FIG. 22 is an enlarged cross-sectional view illustrating the cover panel CVP4 shown in FIG. 21.

Referring to FIG. 21, the cover panel CVP4 may further include a metal material layer MF disposed between the second sub-adhesive film AF1-2 and a hydrophobic material layer HPF. The metal material layer MF may be formed by depositing and/or coating a metal material on the hydrophobic material layer HPF. As an example of the present invention, the metal material layer MF may include silver (Ag) and/or aluminum (Al).

As shown in FIG. 22, a first insulating layer IL1 may be further disposed between the hydrophobic material layer HPF and a second support plate SP2. The first insulating layer IL1 may include an inorganic insulating material. As an example of the present invention, the first insulating layer IL1 may include silicon dioxide (SiO2).

A second insulating layer 1L2 may be further disposed between the metal material layer MF and the second sub-adhesive film AF1-2. The second insulating layer IL2 may include an inorganic insulating material. As an example of the present invention, the second insulating layer IL2 may include silicon dioxide ($SiO_2$). In addition, an anti-oxidation layer may be further disposed between the second insulating layer IL2 and the second sub-adhesive film AF1-2. The anti-oxidation layer may prevent oxidation of the metal material layer MF and may prevent moisture from entering into the metal material layer MF. The anti-oxidation layer may include titanium oxide, for example, $Ti_3O_5$.

The first insulating layer IL1, the hydrophobic material layer HPF, the metal material layer MF, and the second insulating layer 1L2 may be sequentially formed on the second support plate SP2 in the third direction (e.g., the DR3 direction). An adhesive material having adhesiveness might not be interposed between the first insulating layer IL1, the hydrophobic material layer HPF, the metal material layer MF, and the second insulating layer IL2. Since the adhesive force between the metal material layer MF and the hydrophobic material layer HPF is weak, when the second support plate SP2 is coupled to the buffer film BF by the second sub-adhesive film AF1-2, the metal material layer MF may remain attached to the second sub-adhesive film AF1-2 after being separated from the hydrophobic material layer HPF. For example, when the metal material layer MF is separated from the hydrophobic material layer HPF, it may remain attached to second sub-adhesive film by the second insulating layer IL2. Therefore, the hydrophobic material layer HPF and the metal material layer MF may be spaced apart from each other by hundreds of nanometers to thousands of nanometers.

As an example of the present invention, the metal material layer MF and the hydrophobic material layer HPF may be disposed to correspond to the part mounting area EMA. For example, the metal material layer MF and the hydrophobic material layer HPF may overlap with the part mounting area EMA. Since the adhesiveness of the second sub-adhesive film AF1-2 with respect to the second support plate SP2 is lost by the metal material layer MF and the hydrophobic material layer HPF in the part mounting area EMA, the second support plate SP2 and the buffer film BF might not be tightly attached to each other in the part mounting area EMA. Accordingly, the deformation of the second support plate SP2 is not transmitted to the buffer film BF and the display module DM1. Therefore, the deformation of the second support plate SP2 caused by the external impacts may be prevented from leading to the deformation of the display module DM1.

Figure 23:
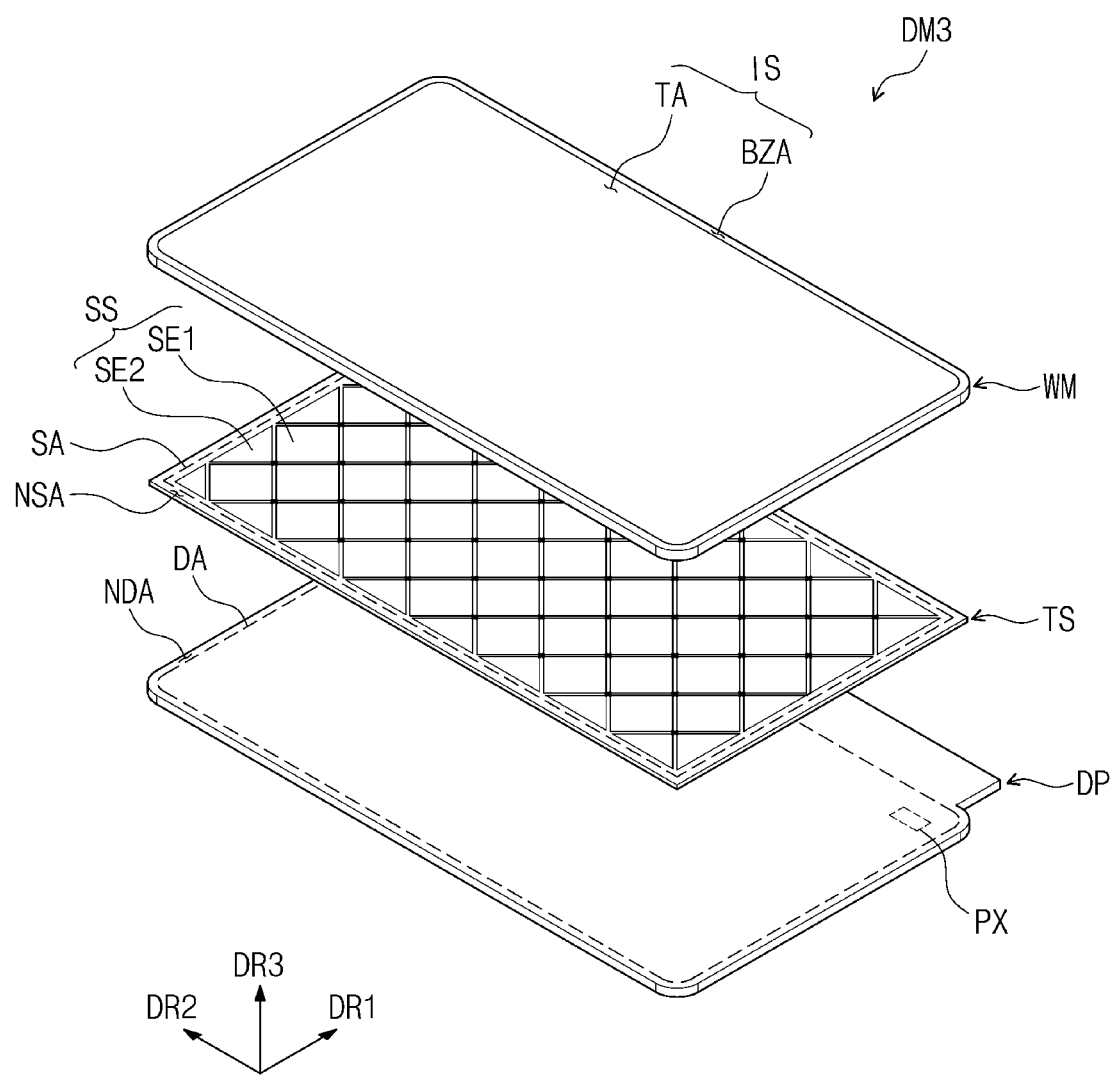
FIG. 23 is an exploded perspective view illustrating a display module, according to an exemplary embodiment of the present invention.
Figure 24:
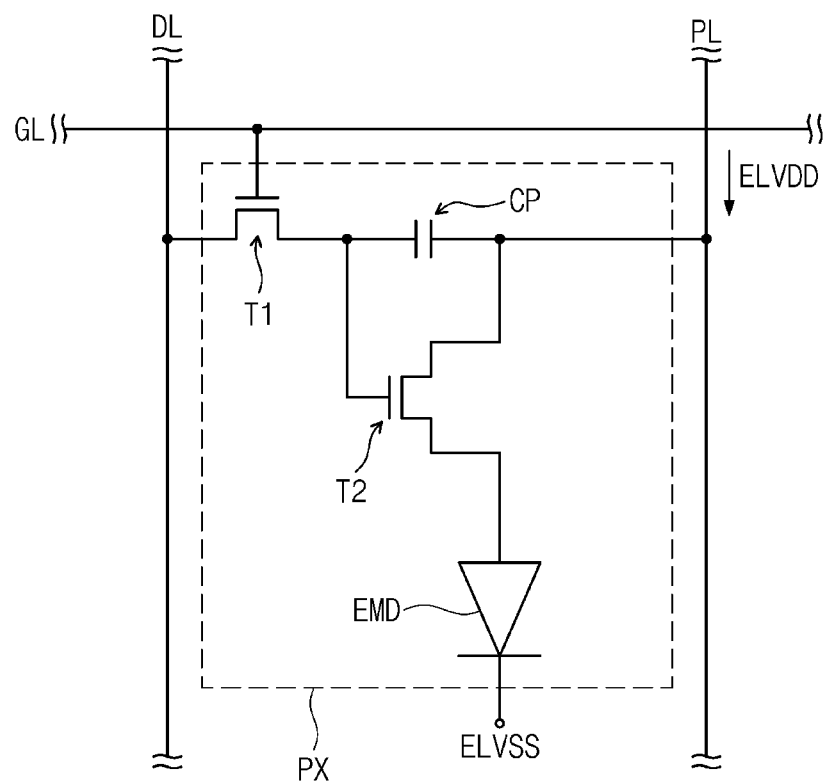
FIG. 24 is an equivalent circuit diagram illustrating a pixel according to an exemplary embodiment of the present invention.
Figure 25:
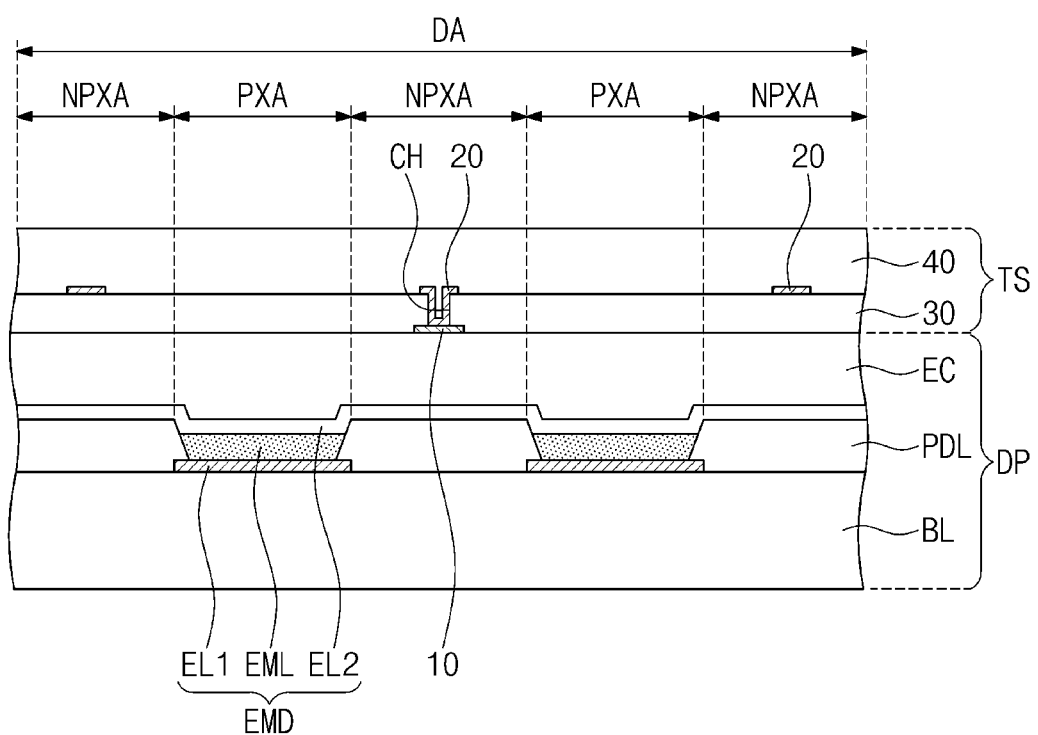
FIG. 25 is a cross-sectional view illustrating some areas of a display module, according to an exemplary embodiment of the present invention.

FIG. 23 is an exploded perspective view illustrating a display module DM3 according to an exemplary embodiment of the present invention, FIG. 24 is an equivalent circuit diagram illustrating a pixel of FIG. 23, and FIG. 25 is a cross-sectional view illustrating some areas of the display module DM3 shown in FIG. 23.

Referring to FIGS. 23 to 25, the display module DM3 according to an exemplary embodiment of the present invention may include a window WM, a touch sensor TS, and a display panel DP. The window WM may correspond to the window WM shown in FIG. 5, and thus details thereof will be omitted for brevity.

The display panel DP may have a shape in which one side protrudes from a side of the non-display area NDA in a first direction (e.g., the DR1 direction) when viewed in a plan view. In the present exemplary embodiment of the present invention, the protruding portion may correspond to a bending area BA (refer to FIGS. 6 and 15) of the display panel DP.

The touch sensor TS may be disposed on the display panel DP. The touch sensor TS may sense an external input and may obtain information on position and intensity of the external input. The external input may include various types of external inputs, such as a part of the user's body, light, heat, and/or pressure. In addition, the touch sensor TS may sense an input in contact with the touch sensor TS as well as inputs approaching or proximate to the touch sensor TS (e.g., hovering).

The touch sensor TS may include a sensing area SA and a non-sensing area NSA. The sensing area SA may overlap the display area DA and the non-sensing area may overlap the non-display area NDA.

The non-sensing area NSA is disposed adjacent to the sensing area SA. The non-sensing area NSA may surround an edge of the sensing area SA when viewed in a plan view. However, the present invention is not limited thereto. For example, the non-sensing are NSA may be disposed adjacent to only a portion of the edge of the sensing area SA or may be omitted, and should not be particularly limited.

A sensing electrode SS may be disposed in the sensing area SA. The sensing electrode SS may include a first sensing electrode SE1 and a second sensing electrode SE2, which may receive different electrical signals from each other. The sensing electrode SS may obtain the information about the external input TC based on a variation in capacitance between the first sensing electrode SE1 and the second sensing electrode SE2.

The first sensing electrode SE1 is provided in plural, and the plurality of first sensing electrodes SE1 may be arranged in the second direction (e.g., the DR2 direction) spaced apart from each other. The plurality of sensing electrodes SE1 may be electrically connected to each other. The second sensing electrode SE2 may be provided in plural, and the plurality of second sensing electrodes SE2 may be arranged in the second direction (e.g., the DR2 direction) spaced apart from each other. The plurality of second sensing electrodes SE2 may be electrically connected to each other.

The touch sensor TS may further include sensing signal lines that are disposed in the non-sensing area NSA and transmit electrical signals provided from the outside to the first sensing electrode SE1 or transmit signals from the second sensing electrode SE2 to the outside.

The touch sensor TS may be disposed on the display panel DP. For example, the first and second sensing electrodes SE1 and SE2 or the sensing signal lines may be directly disposed on the display panel DP. According to an exemplary embodiment of the present invention, the touch sensor TS may be attached to the display panel DP by an adhesive member after being separately formed from the display panel DP. In addition, the touch sensor TS may be disposed on a rear surface of the display panel DP or may be disposed in the display panel DP. The touch sensor TS, according to the exemplary embodiment of the present invention, may be provided in various shapes.

Referring to FIGS. 23 and 24, a plurality of pixels PX may be disposed in the display area DA of the display panel DP. The pixel PX may output a light in response to received electrical signals to display the image IM.

The pixel PX may include a first thin film transistor T1, a second thin film transistor T2, a capacitor CP, and a light emitting device EMD. The first thin film transistor T1, the second thin film transistor T2, the capacitor CP, and the light emitting device EMD are electrically connected to each other.

The first thin film transistor T1 may be a switching device that controls a turn-on or a turn-off of the pixel PX. The first thin film transistor T1 is connected to a gate line GL and a data line DL. The first thin film transistor T1 is turned on in response to a gate signal applied thereto through the gate line GL and applies a data signal applied thereto through the data line DL to the capacitor CP.

The capacitor CP is charged with a voltage corresponding to an electric potential difference between a first power signal ELVDD provided from a power line PL and a signal provided from the first thin film transistor T1. The second thin film transistor T2 applies the first power signal ELVDD provided from the power line PL to the light emitting device EMD in response to the voltage charged in the capacitor CP.

The light emitting device EMD may generate a light or control an amount of the light in response to the electrical signal. For example, the light emitting device EMD may include an organic light emitting device, a quantum dot light emitting device, an electrophoretic device, or an electrowetting device.

The light emitting device EMD may be connected to a power terminal VSS to receive a power signal different from the first power signal ELVDD provided from the power line PL. A driving current corresponding to a difference between the electrical signal provided from the second thin film transistor T2 and a second power signal ELVSS flows through the light emitting device EMD, and the light emitting device EMD may generate the light corresponding to the driving current. However, the present invention is not limited thereto. For example, the pixel PX may include electronic components having various configurations and arrangements and should not be particularly limited.

Referring to FIGS. 24 and 25, the display panel DP may include a base layer BL, a pixel definition layer PDL, the light emitting device EMD, and an encapsulation layer EC. The display panel DP may include a plurality of light emitting areas PXA and a plurality of non-light emitting areas NPXA arranged in the display area DA. FIG. 25 shows an area in which two light emitting areas among the light emitting areas PXA are arranged.

The base layer BL may include a plurality of insulating layers and a plurality of conductive layers. The insulating layers and the conductive layers may form the thin film transistor and the capacitor, which are connected to the light emitting device EMD.

The pixel definition layer PDL may be disposed on the base layer BL. The pixel definition layer PDL may include openings defined therethrough. The openings may define the light emitting areas PXA.

The light emitting device EMD may be disposed on the base layer BL. The light emitting device EMD may be at least partially disposed pin respective openings. The light emitting device EMD outputs the light in response to the electrical signals provided through the thin film transistors T1 and T2 and the capacitor CP, which form the base layer BL, to display the image.

According to the present exemplary embodiment of the present invention, the light emitting device EMD may be an organic light emitting device (OLED). The light emitting device EMD may include a first electrode EL1, a light emitting layer EML, and a second electrode EL2. The light emitting device EMD may activate the light emitting layer EML in accordance with the electric potential difference between the first electrode EL and the second electrode EL2 to generate the light. Accordingly, the light emitting areas PXA may correspond to the area in which the light emitting layer EML is disposed.

Meanwhile, the light emitting areas PXA may have different sizes from each other. For example, each of the light emitting areas PXA may have a different size depending on colors of the light emitted thereby. A uniform light efficiency for various colors may be achieved by providing the light emitting area with a suitable size for each different color.

The encapsulation layer EC may cover the light emitting device EMD. The encapsulation layer EC may include at least one inorganic layer and/or organic layer. The encapsulation layer EC prevents moisture from entering the light emitting device EMD from the outside and protects the light emitting device EMD. In addition, the encapsulation layer EC is disposed between the light emitting device EMD and the touch sensor TS to electrically separate the light emitting device EMD from the touch sensor TS. However, the present invention is not limited thereto. The encapsulation layer EC may include glass and/or plastic, and an inert gas may be filled in between the encapsulation layer EC and the light emitting device EMD. The display panel DP may have various structures.

The touch sensor TS may be disposed on the encapsulation layer EC. For example, the touch sensor TS may be formed on an upper surface of the encapsulation layer EC by being deposited and/or patterned. According to an exemplary embodiment of the present invention, the electronic device ED may further include a member, such as a color filter and/or a buffer layer, interposed between the touch sensor TS and the encapsulation layer EC.

As shown in FIGS. 23 and 25, the touch sensor TS may include a plurality of conductive layers and a plurality of insulating layers, which are stacked one on another in a cross-sectional view. According to the present exemplary embodiment of the present invention, the touch sensor TS may include a first conductive layer 10, a second conductive layer 20, a first insulating layer 30, and a second insulating layer 40, which may be disposed on different layers from each other.

The first conductive layer 10 may be disposed on the display panel DP. The second conductive layer 20 may be disposed on the first conductive layer 10. The first sensing electrode SE1 and the second sensing electrode SE2 may be included in either the first conductive layer 10 or the second conductive layer 20.

Each of the first conductive layer 10 and the second conductive layer 20 includes a plurality of conductive patterns. The conductive patterns may include the above-described first and second sensing electrodes SE1 and SE2.

The conductive patterns of each of the first conductive layer 10 and the second conductive layer 20 might not overlap the light emitting areas PXA when viewed in a plan view. Accordingly, although the first conductive layer 10 and the second conductive layer 20, according to an exemplary embodiment of the present invention, may include an opaque material or have a wide area, the first conductive layer 10 and the second conductive layer 20 do not exert an influence on the image IM displayed through the light emitting areas PXA. However, the present invention is not limited thereto. For example, each of the first conductive layer 10 and the second conductive layer 20 may include a conductive pattern disposed to overlap with at least a portion of the light emitting area PXA.

The first insulating layer 30 may be disposed between the first conductive layer 10 and the second conductive layer 20. The first insulating layer 30 may separate the first conductive layer 10 from the second conductive layer 20 in a cross-sectional view. The first conductive layer 10 and the second conductive layer 20 may be partially electrically connected to each other via a contact hole CH defined through the first insulating layer 30.

The second insulating layer 40 may be disposed on the first insulating layer 30. The second insulating layer 40 may cover the second conductive layer 20. The second insulating layer 40 protects the second conductive layer 20 from an external environment.

The first insulating layer 30 and the second insulating layer 40 may have an insulating property and may include an optically clear material. Therefore, although the light emitting area PXA is covered by the first insulating layer 30 and the second insulating layer 40, the light generated from the light emitting area PXA may be easily perceived above the touch sensor TS.

The first insulating layer 30 and the second insulating layer 40 may include at least one inorganic layer and/or an organic layer. For example, in the case where the first insulating layer 30 and the second insulating layer 40 mainly include the organic layer, the flexibility of the touch sensor TS may be increased. According to an exemplary embodiment of the present invention, in the case where the first insulating layer 30 and the second insulating layer 40 mainly include the inorganic layer, a thin touch sensor TS may be provided, and the touch sensor TS may have increased impact resistance. The first insulating layer 30 and the second insulating layer 40 according to the exemplary embodiment of the present invention may include various materials.

While the exemplary embodiments of the present invention have been shown and described above, it will be understood by one of ordinary skill in the art that modifications and variations in form and detail may be made therein without departing from the spirit and scope of the present invention.

What is claimed is:

1. An electronic device, comprising:
  a display device; and
  a case comprising a bottom portion and a sidewall to define a receiving space in which the display device is accommodated, the display device comprising:
   a display module comprising a display panel displaying an image and comprising a folding area and a plurality of non-folding areas, which are defined therein, and a circuit board electrically connected to the display panel, the folding area being folded about an imaginary folding axis and the non-folding areas being disposed adjacent to both sides of the folding area when viewed in a plan view; and
   a cover panel disposed on a rear surface of the display module and comprising a plurality of layers, wherein a receiving groove is defined in the bottom portion of the case to correspond to a part mounting area of the circuit board, the circuit board is disposed on a rear surface of the cover panel, and the cover panel is provided with an air gap portion defined therein
  between at least two layers among the layers to correspond to the part mounting area of the circuit board.

2. The electronic device of claim 1, wherein the cover panel comprises:
  a support plate supporting the display module; and
  a first adhesive film disposed between the support plate and the display module.

3. The electronic device of claim 2, wherein the first adhesive film is provided with an opening defined therethrough to correspond to the air gap portion.

4. The electronic device of claim 3, wherein the cover panel further comprises:
  a buffer film disposed between the first adhesive film and the display module; and
  a second adhesive film disposed between the buffer film and the display module.

5. The electronic device of claim 4, wherein the air gap portion comprises an air gap defined by the opening between the buffer film and the support plate.

6. The electronic device of claim 4, wherein the cover panel further comprises a first step difference film disposed between the support plate and the buffer film corresponding to the opening.

7. The electronic device of claim 6, wherein the first step difference film has a thickness smaller than the first adhesive film.

8. The electronic device of claim 7, wherein the first step difference film is disposed on the support plate.

9. The electronic device of claim 6, wherein the first step difference film has a width smaller than a width of the opening.

10. The electronic device of claim 2, wherein the support plate comprises:
  a first support plate disposed in a first non-folding area adjacent to a first side of the folding area; and
  a second support plate spaced apart from the first support plate and disposed in a second non-folding area adjacent to a second side of the folding area.

11. The electronic device of claim 10, wherein the first adhesive film comprises:
  a first sub-adhesive film fixing the first support plate to the first non-folding area; and
  a second sub-adhesive film fixing the second support plate to the second non-folding area.

12. The electronic device of claim 11, wherein the cover panel further comprises a second step difference film disposed between the first and second sub-adhesive films and interposed between the display module and the support plate.

13. The electronic device of claim 12, wherein the second step difference film comprises:

a first sub-step difference film disposed on the first support plate; and a second sub-step difference film disposed on the second support plate.

14. The electronic device of claim 1, wherein the display module further comprises a window disposed on the display panel and comprising a flexible material.

\* \* \* \* \*